United States Patent
Chien et al.

(10) Patent No.: US 8,699,258 B2
(45) Date of Patent: Apr. 15, 2014

(54) VERIFICATION ALGORITHM FOR METAL-OXIDE RESISTIVE MEMORY

(75) Inventors: Wei-Chih Chien, Sijhih (TW); Ming-Hsiu Lee, Hsinchu (TW); Yan-Ru Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 267 days.

(21) Appl. No.: 13/212,493

(22) Filed: Aug. 18, 2011

(65) Prior Publication Data

US 2012/0188813 A1 Jul. 26, 2012

Related U.S. Application Data

(60) Provisional application No. 61/435,066, filed on Jan. 21, 2011.

(51) Int. Cl.
*G11C 11/00* (2006.01)

(52) U.S. Cl.
USPC .......................................... 365/148; 365/163

(58) Field of Classification Search
CPC ................... G11C 13/0069; G11C 11/5685
USPC ................................................ 365/148, 163
See application file for complete search history.

(56) References Cited

U.S. PATENT DOCUMENTS

| | | | |
|---|---|---|---|
| 7,084,691 B2 | 8/2006 | Hsu | |
| 7,098,101 B1 | 8/2006 | Li et al. | |
| 7,126,152 B2 | 10/2006 | Ishida et al. | |
| 7,742,332 B2 | 6/2010 | Nakai | |
| 7,800,094 B2 | 9/2010 | Ho et al. | |
| 8,059,450 B2 * | 11/2011 | Xi et al. | 365/148 |
| 8,094,488 B2 | 1/2012 | Lee | |
| 2005/0260839 A1 | 11/2005 | Allenspach et al. | |
| 2006/0109704 A1 | 5/2006 | Seo et al. | |
| 2006/0131554 A1 | 6/2006 | Joung et al. | |
| 2006/0203430 A1 | 9/2006 | Pinnow et al. | |
| 2006/0274574 A1 | 12/2006 | Choi et al. | |
| 2007/0045692 A1 | 3/2007 | Kim et al. | |
| 2007/0114587 A1 | 5/2007 | Seo et al. | |
| 2008/0304312 A1 | 12/2008 | Ho et al. | |
| 2011/0188292 A1 * | 8/2011 | Joo et al. | 365/148 |

FOREIGN PATENT DOCUMENTS

WO 2009002477 A1 12/2008

OTHER PUBLICATIONS

Lee, Dongsoon, et al., "Resistance Switching of the Nonstoichiometric Zirconium Oxide for Nonvolatiel Memory Applications," IEEE Electron Device Letters vol. 26, No. 9, Oct. 2005, 3 pages.
Baek, I.G., "Highly Scalable Non-volatile Resistive Memory using Simple Binary Oxide Driven by Asymmetric Unipolar Voltage Pulses," IEEE IEDM 2004 4 pages.
Chiahua Ho, et al., "A Highly Reliable Self-Aligned Graded Oxide WOx Resistance Memory: Conduction Mechanisms and Reliability," 2007 Symposium on VLSI Technology Digest of Technical Papers, Jun. 12-14, 2007, 228-229.
Hosoi, Y., et al., "High Speed Unipolar Switching Resistance RAM (RRAM) Technology," IEEE IEDM Dec. 11-13, 2006, 4 pages.

* cited by examiner

*Primary Examiner* — Son Dinh
*Assistant Examiner* — Nam Nguyen
(74) *Attorney, Agent, or Firm* — Haynes Beffel & Wolfeld LLP

(57) ABSTRACT

Memory devices and methods for operating such devices are described which can effectively program the metal-oxide memory elements in an array, while also avoiding applying unnecessarily high voltage pulses. Programming operations described herein include applying a lower voltage pulse across a metal-oxide memory element to establish a desired resistance state, and only applying a higher voltage pulse when the lower voltage pulse is insufficient to program the memory element. In doing so, issues associated with applying unnecessarily high voltages across the memory element can be avoided.

23 Claims, 24 Drawing Sheets

VERIFICATION ALGORITHM FOR METAL-OXIDE RESISTIVE MEMORY

CROSS-REFERENCE TO RELATED APPLICATIONS

This application claims the benefit of U.S. Provisional Application No. 61/435,066, entitled "Operation Window and Verification Algorithm for Tungsten-Oxide Resistive Memory" filed 21 Jan. 2011, which is incorporated by reference herein.

This application is related to U.S. application Ser. No. 12/965,126, entitled "Set Algorithm for Phase Change Memory Cell" filed 10 Dec. 2010, which is incorporated by reference herein.

BACKGROUND

1. Field of the Invention

The present invention relates to metal-oxide based memory devices and methods for operating such devices.

2. Description of Related Art

Some metal-oxides can be caused to change resistance between two or more suitable ranges by application of electrical pulses at levels suitable for implementation in integrated circuits. Metal-oxides have generated interest in use in resistive random access memory (RRAM) devices because of their simple structure, compatibility with standard CMOS processes, high speed, low power consumption, and potential for 3D stacking.

Tungsten oxide $WO_x$ based RRAM has been shown to exhibit good resistive switching characteristics between two or more resistance ranges. See, U.S. Pat. No. 7,800,094 entitled "Memory Devices Having an Embedded Resistance Memory with Tungsten Compound and Manufacturing Methods," filed 12 Dec. 2007.

It is important to maintain a relatively large resistance window between the resistance states in order to reliably determine the stored data value. However, due to variations in materials, manufacturing processes, and the operating environment, the pulse characteristics (e.g. voltage amplitude, pulse width, etc.) required to change the resistance state of a metal-oxide memory cell will vary across an array.

One attempt at addressing the variation in required pulse characteristics, involves applying a single high voltage pulse capable sufficient to program each memory element to the desired resistance state. However, this results in at least some memory elements experiencing significantly higher voltages than are necessary to cause the transition to the desired resistance state. Over time, these unnecessarily high voltages can cause variations in the resulting resistance of the metal-oxide material. These variations reduce the resistance window, resulting in data reliability issues and possible failure of the device.

It is therefore desirable to provide methods for operating metal-oxide memory devices which address the endurance issues discussed above and result in improved reliability.

SUMMARY

Memory devices and methods for operating such devices are described which can effectively program the metal-oxide memory elements in an array, while also avoiding applying unnecessarily high voltage pulses. Programming operations described herein include applying a lower voltage pulse across a metal-oxide memory element to establish a desired resistance state, and only applying a higher voltage pulse when the lower voltage pulse is insufficient to program the memory element. In doing so, issues associated with applying unnecessarily high voltages across the memory element can be avoided.

A method is described herein for operating a metal-oxide memory element programmable to a plurality of resistance states. The method includes applying a first bias arrangement to establish a first resistance state in the plurality of resistance states, the first bias arrangement comprising a first voltage pulse. The method includes determining whether the metal-oxide memory element is in the first resistance state after applying the first bias arrangement. If the memory element is not in the first resistance state, the method includes then applying a second bias arrangement to the metal-oxide memory element to establish the first resistance state. The second bias arrangement comprises a second voltage pulse having a pulse height greater than that of the first voltage pulse.

If, following the second bias arrangement, the memory element still is not in the first resistance state, one or more further attempts can be made to program the memory element by applying additional voltage pulses having pulse heights greater than that of the first voltage pulse. If a predetermined number of further attempts have been made and the memory cell remains unprogrammed, the memory cell may be replaced using redundancy techniques.

A memory device described herein includes a metal-oxide memory element programmable to a plurality of resistance states. The memory device also includes a controller including logic to apply the bias arrangements described above.

Other aspects and advantages of the present invention can be seen on review of the drawings, the detailed description, and the claims which follow.

DETAILED DESCRIPTION

A detailed description of embodiments of the present invention is provided with reference to the FIGS. 1-16.

Figure 1:
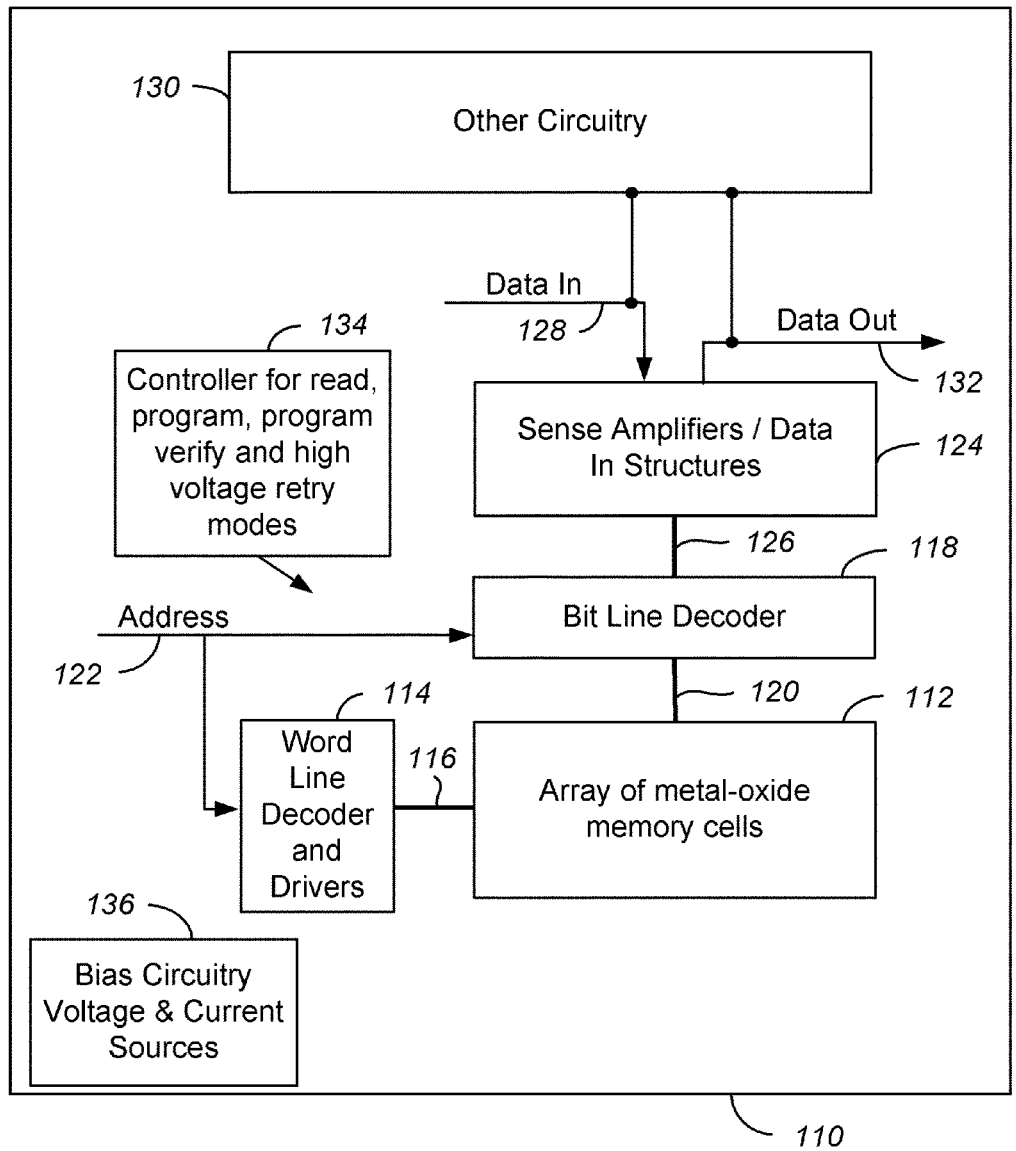
FIG. 1 illustrates a simplified block diagram of an integrated circuit including a memory array of memory cells having metal-oxide memory elements which can be operated as described herein.

FIG. 1 is a simplified block diagram of an integrated circuit 110 including a memory array 112 of memory cells having metal-oxide memory elements which can be operated as described herein. A word line decoder 1114 having read, program, program verify and high voltage program retry modes is coupled to and in electrical communication with a plurality of word lines 116 arranged along rows in the memory array 112. A bit line (column) decoder 118 is in electrical communication with a plurality of bit lines 120 arranged along columns in the array 112 for reading and programming the metal-oxide memory cells in the memory array 112. Addresses are supplied on bus 122 to word line decoder and drivers 114 and bit line decoder 118. Sense amplifiers and data-in structures in block 124, including voltage and/or current sources for the read, program, program verify and high voltage program retry modes are coupled to bit line decoder 118 via data bus 126. Data is supplied via a data-in line 128 from input/output ports on integrated circuit 110, or from other data sources internal or external to integrated circuit 110, to data-in structures in block 124. Other circuitry 130 may be included on integrated circuit 110, such as a general purpose processor or special purpose application circuitry, or a combination of modules providing system-on-a-chip functionality supported by array 112. Data is supplied via a data-out line 132 from the sense amplifiers in block 124 to input/output ports on integrated circuit 110, or to other data destinations internal or external to integrated circuit 110.

A controller 134 implemented in this example, using a bias arrangement state machine, includes logic which controls the application of bias circuitry voltage and current sources 136 for the application of bias arrangements described herein. Controller 134 may be implemented using special-purpose logic circuitry as known in the art. In alternative embodiments, controller 134 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 134.

Figure 2:
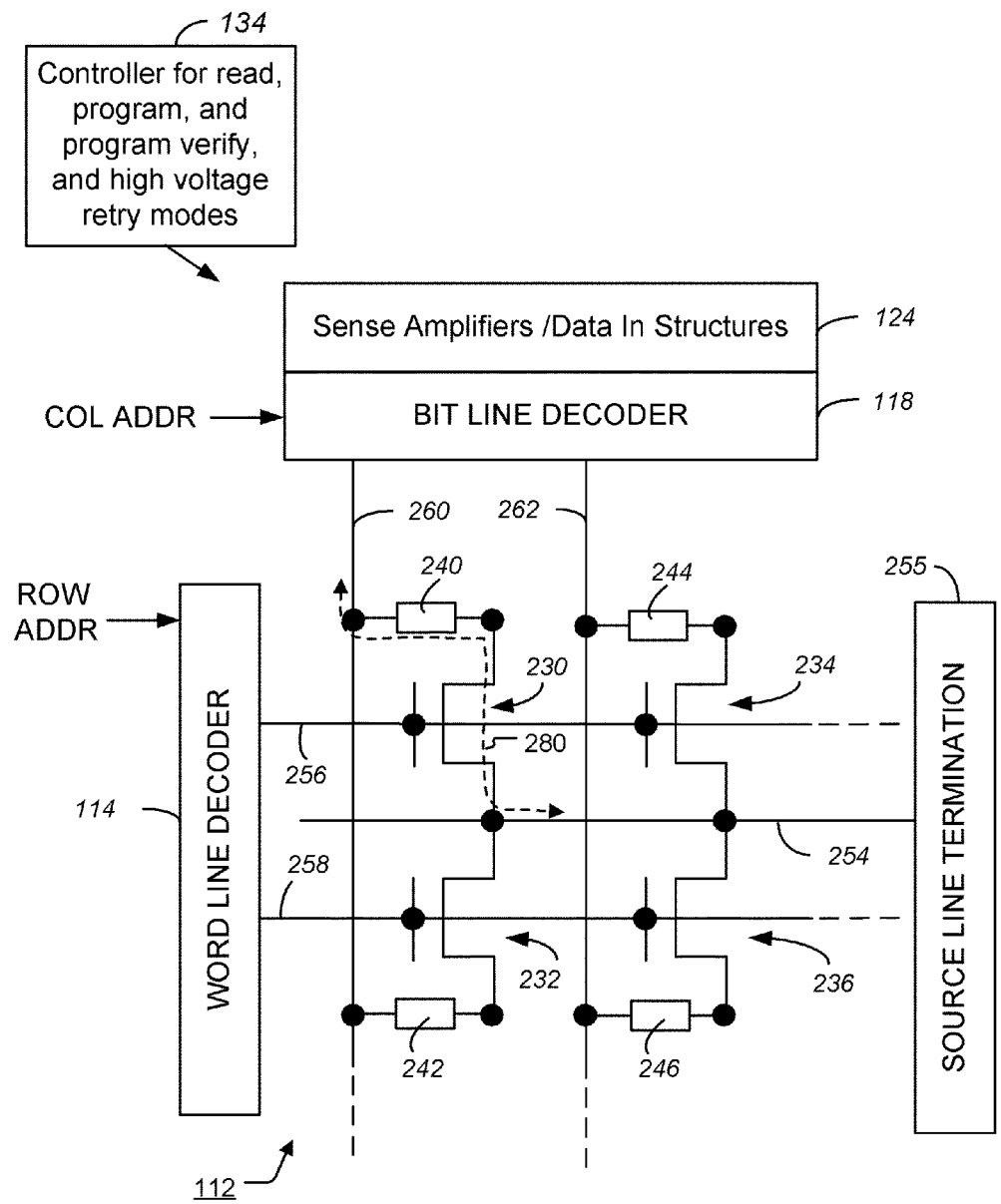
FIG. 2 illustrates a portion of the memory array of FIG. 1.

FIG. 2 illustrates a portion of the memory array 112 of FIG. 1. In FIG. 2, each of the memory cells of array 112 includes an access transistor (or other access device such as a diode) and a metal-oxide memory element. In FIG. 2, four memory cells 230, 232, 234, 236 having respective metal-oxide memory elements 240, 242, 244, 246 are illustrated, representing a small section of an array that can include millions of memory cells. The memory elements of the memory cells are programmable to a plurality of resistance states including a lower resistance state and a higher resistance state.

Sources of each of the access transistors of memory cells 230, 232, 234, 236 are connected in common to source line 254 that terminates in a source line termination circuit 255, such as a ground terminal. In another embodiment the source lines of the access devices are not electrically connected, but independently controllable. The source line termination circuit 255 may include bias circuitry such as voltage sources and current sources, and decoding circuits for applying bias arrangements other than ground to the source line 254 in some embodiments.

A plurality of word lines including word lines 256, 258 extend in parallel along a first direction. Word lines 256, 258 are in electrical communication with word line decoder 214. The gates of access transistors of memory cells 230 and 234 are connected to word line 256, and the gates of access transistors of memory cells 232 and 236 are connected to word line 258.

A plurality of bit lines including bit lines 260, 262 extend in parallel in a second direction and are in electrical communication with bit line decoder 218. In the illustrated example each of the memory elements are arranged between the drain of the corresponding access transistor and the corresponding bit line. Alternatively, the memory elements may be on the source side of the corresponding access device.

It will be understood that the memory array 112 is not limited to the array configuration illustrated in FIG. 2, and other array configurations can alternatively be used. Additionally, instead of MOS transistors, bipolar transistors or diodes may be used as access devices in some embodiments.

In operation, each of the memory cells 230, 232, 234, 236 store a data value depending upon the resistance of their respective memory elements. The data value may be determined, for example, by comparison of current on the bit line of a selected memory cell to that of a suitable reference current. The reference current can be established so that a predetermined range of bit line currents correspond to a logical '0', and a differing range of bit line currents correspond to a logical '1'. For a memory cell having a memory element programmable to three or more resistance states, reference currents can be established so that differing ranges of bit line currents correspond to each of the three or more states.

Reading or programming of a selected memory cell in the memory array 112 can be achieved by applying appropriate bias arrangements to the word lines and bit lines, so that current flows through the selected memory element. The bias arrangements may each comprise one or more voltage pulses applied to one or more of the word lines and bit lines, so that one or more resultant voltage pulses are produced across the memory element of the selected memory cell. For example, a current path 280 through selected memory cell 230 and corresponding memory element 240 is established by applying voltage pulses to bit line 230, word line 256, and source line 254 sufficient to turn on the access transistor of the memory cell 230 and induce current to flow in path 280 from the bit line 260 to the source line 254, or vice versa. The level and duration of the voltage pulses applied are dependent upon the operation performed, e.g. a reading operation or a programming operation.

In a read (or sense) operation of the data value stored in the memory cell 230, bias circuitry coupled to the word line 256, bit line 260 and source line 254 applies a read bias arrangement which does not result in the memory element 240 undergoing a chance in resistive state. The amount current in path 280 is dependent upon the resistance of the memory element 240 and thus indicates the data value stored in the memory cell 230. The data value may be determined for example by comparison of the current in path 280 with one or more suitable reference currents.

In a program operation of a data value to be stored in the memory cell 230, bias circuitry coupled to the word line 256, bit line 260 and source line 254 applies a bias arrangement sufficient to induce a programmable change in the resistance state of the memory element 240.

Depending upon the operation to be performed, the bias arrangements may provide a positive voltage difference from the bit line 260 to the drain terminal of the access transistor of the memory cell 230 (referred to herein as a positive voltage pulse across the memory element 240). The bias arrangements may also provide a negative voltage difference from the bit line 260 to the drain terminal of the access transistor of the memory cell 230 (referred to herein as a negative voltage pulse across the memory element 240).

Techniques for both unipolar and bipolar operation of the metal-oxide memory elements are described herein. Unipolar operation refers to the application of voltage pulses which all have the same voltage polarity across the memory element, such that current is induced to flow only in a single direction through the memory element during operation. For example, the programming voltage pulses may each produce a positive voltage across the memory element 240, such that current flows in path 280 from the bit line 260 to the source line 254. Bipolar operation refers to operating a memory element by applying both positive and negative voltage pulses across the memory element, such that current is induced to flow in both directions through the memory element during operation.

Figure 3:
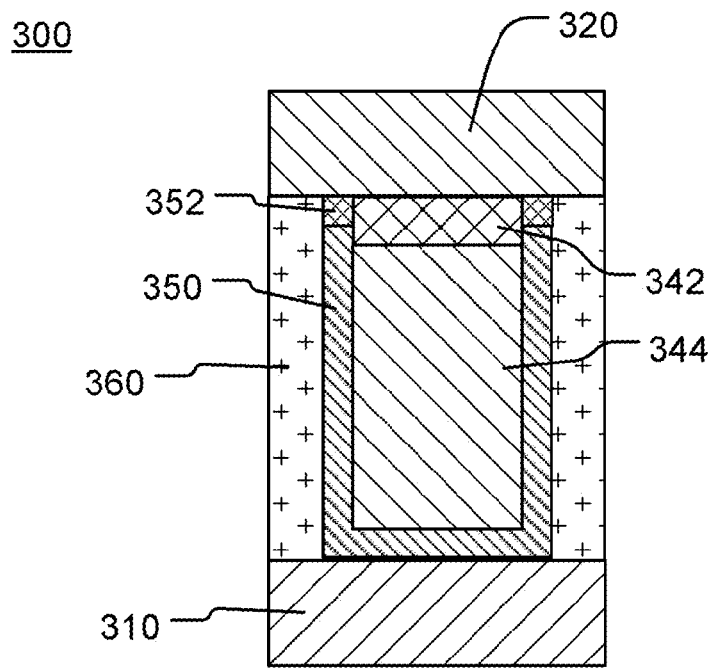
FIG. 3 illustrates a cross-sectional view of an exemplary metal-oxide memory cell.

FIG. 3 illustrates a cross-sectional view of an exemplary metal-oxide memory cell 300 which can be operated as described herein. The memory cell 300 includes a liner layer 350 between a bottom electrode 310 and a conductive element 344. The conductive element 344 is surrounded by the liner layer 350 and extends through dielectric 360 to contact a metal-oxide memory element 342. A top electrode 320 is on the memory element 342. As shown in FIG. 3, the liner layer 350 includes a field enhancement element 352 (discussed below) surrounding the memory element 342.

The top electrode 320 is an electrically conductive element which in some embodiments is a portion of a bit line. The top electrode 320 may comprise, for example, one or more elements selected from the group consisting of Ti, W, Yb, Tb, Y, Sc, Hf, Zr, Nb, Cr, V, Zn, Re, Co, Rh, Pd, Pt, Mo, Al, Ta, Cu, Pt, Ir, La, Ni, N, O, and Ru and combinations thereof. In some embodiments the top electrode 320 may comprise more than one layer of material.

The bottom electrode 310 is an electrically conductive element. The bottom electrode 310 may for example comprise doped polysilicon, which may be the terminal of a diode or access transistor. Alternatively, the bottom electrode 310 may comprise, for example, any of the materials discussed above with reference to the top electrode 310.

The conductive element 344 may comprise, for example, any of the materials discussed above with reference to the top electrode 320.

The metal-oxide memory element 342 comprises metal-oxide material which is programmable to a plurality of resistance states. In some embodiments memory element 340 may comprise one or more metal oxides from the group of tungsten oxide, titanium oxide, nickel oxide, aluminum oxide, copper oxide, zirconium oxide, niobium oxide, tantalum oxide, titanium nickel oxide, Cr-doped $SrZrO_3$, Cr-doped $SrTiO_3$, PCMO and LaCaMnO. In some embodiments the memory element 340 may comprise WO/Cu or Ag, TiO/Cu or Ag, NiO/Cu or Ag, AlO/Cu or Ag, CuO/Cu or Ag, ZrO/Cu or Ag, NbO/Cu or Ag, TaO/Cu or Ag, TiNO/Cu or Ag, Cr-doped $SrZrO_3$/Cu or Ag, Cr-doped $SrTiO_3$/Cu or Ag, PCMO/CU or Ag, LaCaMnO/Cu or Ag, and $SiO_2$/Cu or Ag.

The liner layer 350 may comprise for example a layer of TiN or a bi-layer of silicon nitride and TiN. Other materials can be used for the liner layer 350 as well.

As shown in FIG. 3, the field enhancement element 352 surrounds the memory element 342 at the level at which contact to the top electrode 320 is made. The field enhancement element 352 may for example comprise $TiNO_x$, SiO2, $HfO_x$, $TiNO_x$, $TiO_x$, $AlO_x$, $WO_x$, etc, and is preferably chosen so that the material of the field enhancement element 352 has a higher resistance than that of the memory element 142.

In the illustrated embodiment the conductive element 344 comprises tungsten, the memory element 340 comprises tungsten oxide, the liner layer 350 comprises TiN or a bi-layer of silicon nitride and TiN, and the field enhancement element 352 comprises $TiNO_x$.

The memory cell 300 can be manufactured as follows. Following deposition of the dielectric 360 on the bottom electrode 310, etching is performed to form an opening through the dielectric 360 to expose the top surface of the bottom electrode 310. A sidewall spacer comprising for example SiN can then be formed on the sidewalls of the opening. A conformal material of liner layer 350 is then deposited on the sidewall spacer within the opening and on the top surface of the bottom electrode 310. The conductive element 344 is then formed by depositing tungsten material to fill the opening using for example Chemical Vapor Deposition CVD, followed by a planarization step such as Chemical Mechanical Polishing CMP. Next, oxidation of a portion of the conductive element 344 and the liner layer 350 forms the memory element 342 and field enhancement element 352 respectively. As a result of the oxidation, the memory element 342 and field enhancement element 352 are self-aligned with the remaining portions of the conductive element 344 and the liner layer 350 respectively. The oxidation can comprise Rapid Thermal Oxidation at a temperature of about 500 degrees Celsius. Next, the top electrode 320 is formed, resulting in the structure illustrated in FIG. 3.

In the illustrated embodiment of FIG. 3, the oxidation results in the memory element 342 being thicker than the field enhancement element 352. As a result of this shorter thickness, the electric field between the top electrode 320 and the liner layer 350 in operation is greater than that between top electrode 320 and the conductive element 344.

Figure 4:
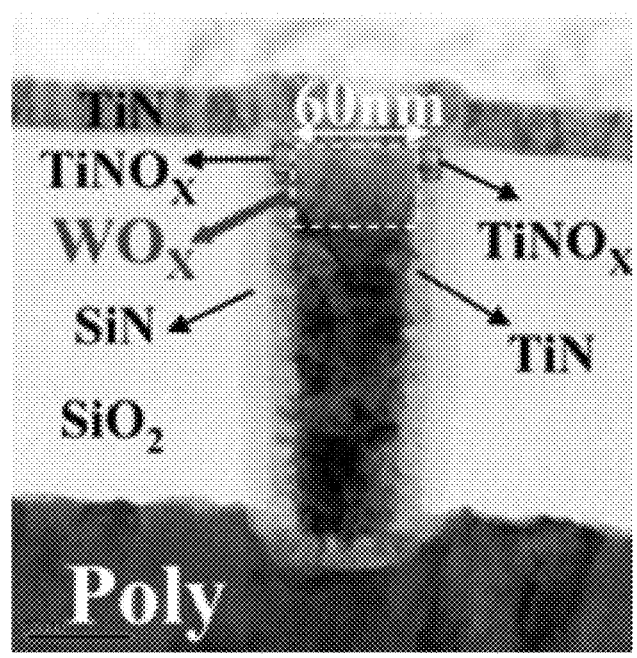
FIG. 4 is a TEM image of metal-oxide memory cell having the structure illustrated in FIG. 3.

FIG. 4 illustrates a TEM image of a memory cell having the structure illustrated in FIG. 3. The memory cell in FIG. 4 includes a tungsten oxide $WO_x$ memory element having a width of about 60 nm. Tungsten oxide memory cells like those shown in FIG. 4 were measured to obtain the data presented herein.

Bipolar Operation

Figure 5A:
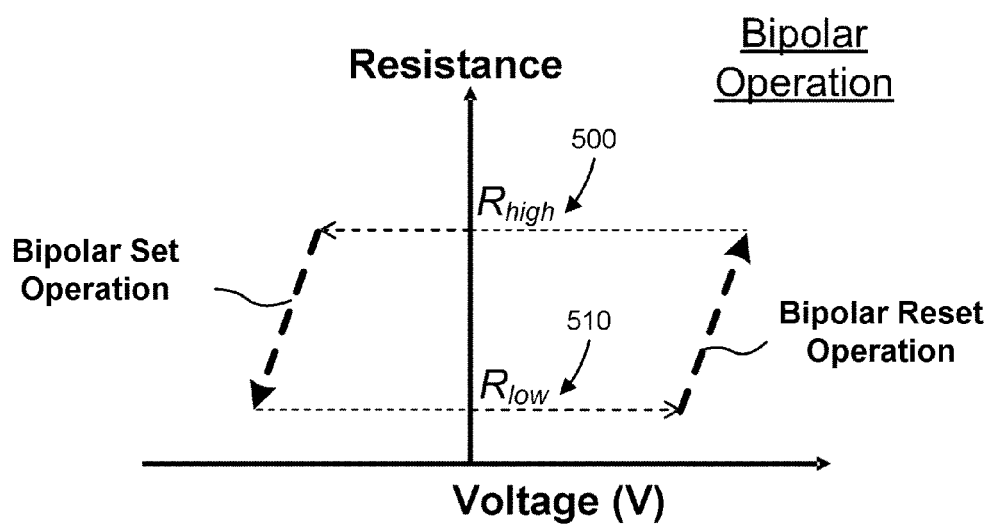
FIG. 5A illustrates a bipolar operation sequence for storing a one-bit data value in a metal-oxide memory element.

FIG. 5A conceptually illustrates a bipolar operation for storing a one-bit data value in a metal-oxide memory cell. In FIG. 5A the memory element is programmable to a lower resistance set state ($R_{low}$) 510 and a higher resistance reset state ($R_{high}$) 500. In some embodiments the memory element may be programmable to one or more additional resistance states.

As represented by the arrows of FIG. 5A, programming operations are performed on the memory cell to change the resistance state of the memory element between the lower resistance state 510 and the higher resistance state 500. As shown in FIG. 5A, a reset operation involves applying a positive voltage across the memory element of the memory cell to change the resistance from the lower resistance state 510 to the higher resistance state 500. A set operation involves applying a negative voltage across the memory element of the memory cell to change the resistance from the higher resistance state 500 to the lower resistance state 510. As shown in FIG. 5A, the voltage applied in the reset operation is opposite the polarity of the voltage applied in the set operation.

Figure 5B:
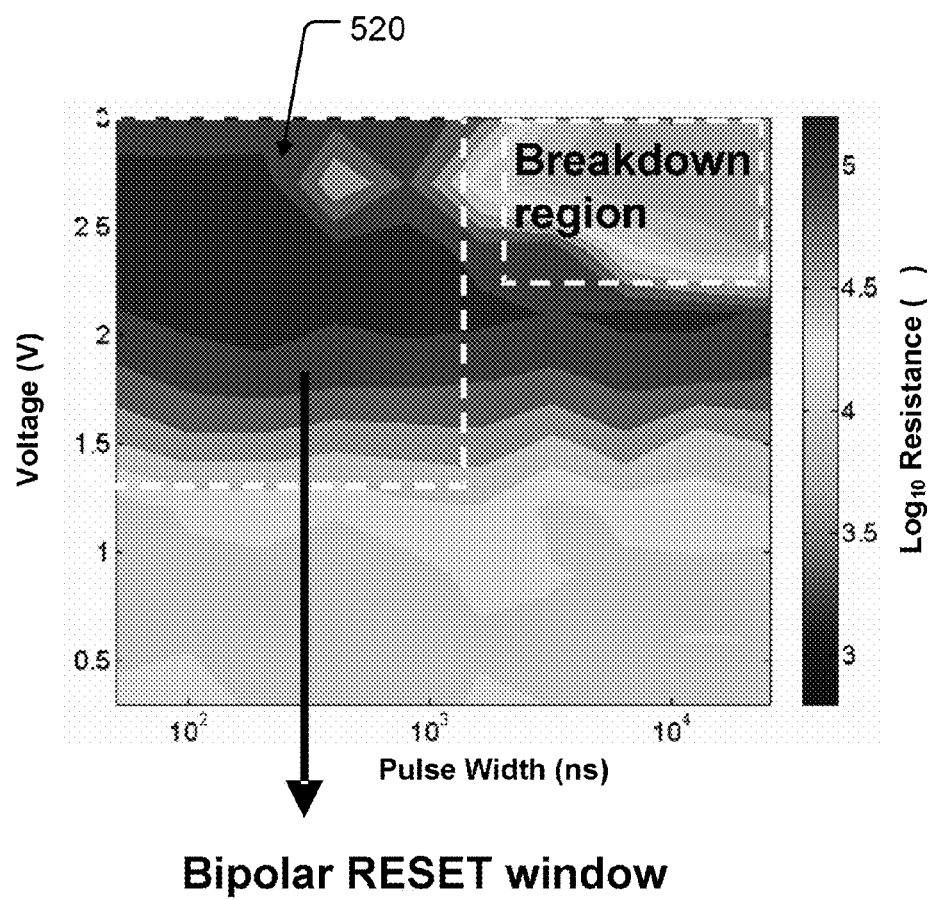
FIG. 5B is a Shmoo plot of the measured resistance of a metal-oxide memory element in response to pulses having various pulse characteristics.

FIG. 5B is a Shmoo plot of the measured resistance of a metal-oxide memory element in response to pulses having various pulse characteristics. In FIG. 5B, the pulse widths of the applied pulses were varied over the range of {50, 100, 200, ..., 25600 ns} and the pulse heights were varied over the range {0.3, 0.6, 0.9, ..., 3 Volts}. In the data in FIG. 5B, the initial resistance state is a low resistance set state having a resistance less than about 10 Kohm. In between applied pulses, the initial low resistance set state was established by performing an appropriate set operation.

As shown in FIG. 5B, a subset of the applied pulses having characteristics within region 520 are shown to successfully induce a change from the initial low resistance set state 510 to the desired high resistance reset state 500. The characteristics of the applied pulses within region 520 are referred to herein as the bipolar reset window.

The characteristics of one or more programming pulses for use in a subsequent bipolar reset operation of the memory element can then be selected based on the pulse characteristics which fall within region 520. For example, the reset pulse used to change the memory element from the low resistance set state 510 to the high resistance reset state 500 may be a pulse selected from the subset of pulses. Additional considerations, such as limiting or minimizing the amount of energy delivered to the memory element, may also be used in selecting the reset pulse characteristics.

Figure 5C:
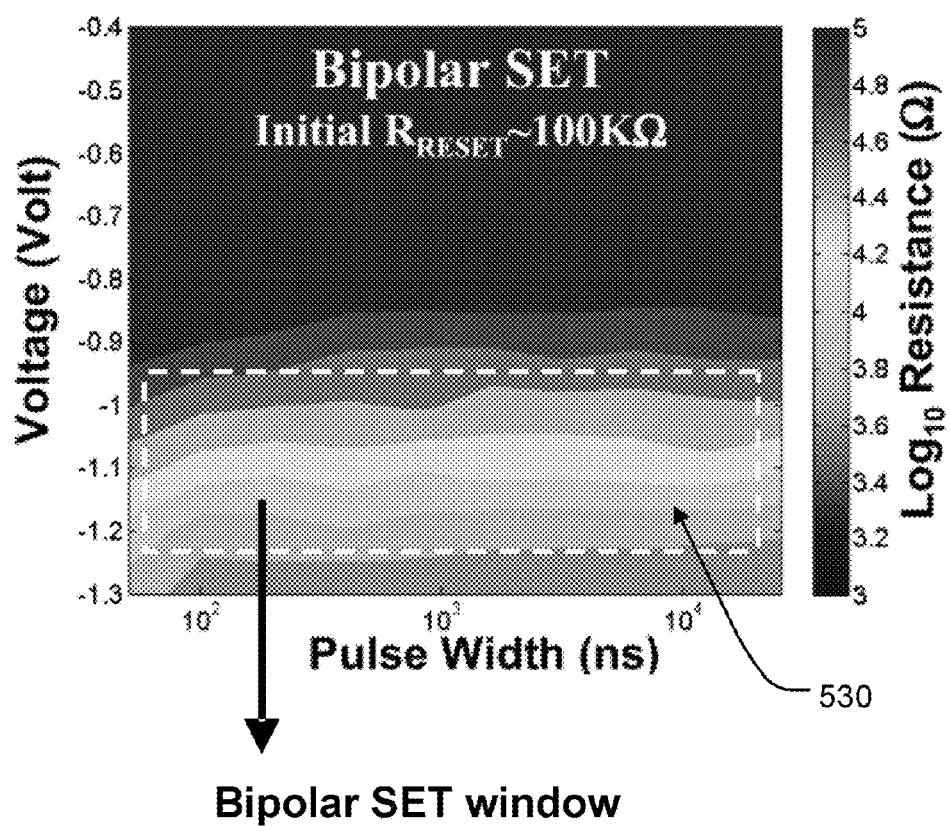
FIG. 5C is a Shmoo plot of the measured resistance of a metal-oxide memory element in response to pulses having various pulse characteristics.

FIG. 5C is a Shmoo plot of the measured resistance of a metal-oxide memory element in response to pulses having various pulse characteristics. The pulse widths of the applied pulses were varied over the range of {50, 100, 200, ..., 25600 ns} and the pulse heights were varied over the range {−0.6, −0.7, ..., −1.5 Volts}. In the data in FIG. 5C, the initial resistance state is a high resistance reset state having a resistance of about 100 Kohm. In between applied pulses, the initial high resistance reset state was established by performing an appropriate reset operation.

As shown in FIG. 5C, a subset of the applied pulses having characteristics within region 530 are shown to successfully induce a change from the initial high resistance reset state 500 to the desired low resistance set state 510. The characteristics of the applied pulses within region 530 are referred to herein as the bipolar set window. The characteristics of one or more programming pulses for use in subsequent bipolar set operation of the memory element can then be selected based on the pulse characteristics which fall within region 530.

As can be seen in FIG. 5B, the resistance of the metal-oxide memory element within the bipolar reset window (given by region 520) varies gradually as a function of the applied pulse height. In other words, the bipolar reset operation has a wide programming margin over which the resistance of the memory element is relatively insensitive to the applied pulse height. This wide programming margin ensures that the memory elements can be reliably programmed to the higher resistance state 500, without the need to perform a program verify step. A program verify step refers to a read operation which is performed after a programming operation, in order to determine whether the programming operation has successfully programmed the memory element to the desired resistance state. The absence of a program verify step enables a relatively high speed bipolar reset operation.

In contrast, as can be seen upon comparison of FIGS. 5B and 5C, the resistance of the metal-oxide memory element within the bipolar set window (given by region 530) varies more rapidly as a function of the applied pulse height. In other words, the bipolar set operation has a relatively small programming margin. As a result, bipolar set operations described herein include one or more program verify steps to ensure the memory element has been properly set to the low resistance set state 510. In addition, the program verify steps can avoid setting the resistance of the memory element unnecessarily low. An unnecessarily low resistance value can result in higher currents during a reset operation, which can damage the memory element and limit the endurance of the device.

Figure 6:
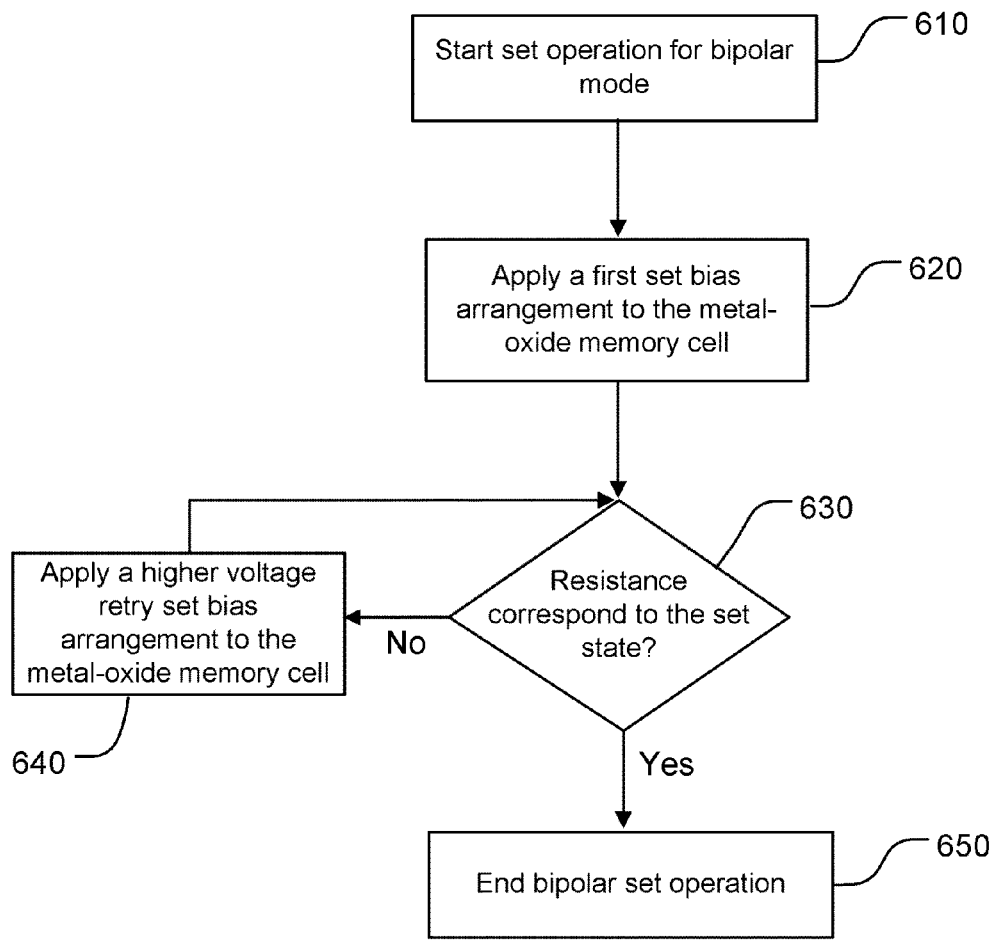
FIG. 6 is a flow chart of an operational sequence of a bipolar set operation including verification and high voltage retry.

FIG. 6 is a flow chart of an operational sequence 600 of a bipolar mode set operation for programming a selected memory cell from the higher resistance state 500 to the lower resistance state 510. The bipolar set operation starts at step 610. Step 610 may include, or in some embodiments be preceded by, a read operation to determine if the selected memory cell needs to be programmed. The read operation can be accomplished by applying a read bias arrangement to the memory cell to induce current to flow through the memory element which is insufficient to cause a change in resistive state. The resistance state may be determined for example by comparison of the current with one or more suitable reference currents.

Next, at step 620 a first set bias arrangement is applied to the memory cell to establish the lower resistance state 510. In this example, the first set bias arrangement is a first voltage pulse having a first pulse height applied across the memory element. Alternatively, the first set bias arrangement may include more than one pulse. The number of pulses, and their respective pulse heights and pulse widths, can be determined empirically for each embodiment.

Next, at step 630 the resistance of the memory element is read to determine whether the memory element has been programmed to the lower resistance state 510. If the memory element is not in the lower resistance state 510, a higher voltage retry reset bias arrangement is then applied at step 640. The retry reset bias arrangement comprises a voltage pulse having a pulse height across the memory element which is greater than the pulse height of the voltage pulse applied at step 620.

The operational sequence 600 then continues back to step 630 to determine whether the memory element has been programmed to the lower resistance state. The operational sequence 600 continues in the loop of steps 640 and 630, until the memory element has been successfully programmed, or until a predetermined number of retry bias arrangements have been applied. In this example, the pulse height of the pulses applied across the memory element is increased between each iteration of step 640. If in step 630 it is determined that the memory element has successfully been programmed to the lower resistance state 510, the operational sequence 600 ends at step 650. If the predetermined number of retry bias arrangements have been made, and the memory element remains unprogrammed, the memory element is defective and can be replaced using redundancy techniques.

In one embodiment, the predetermined number of retry bias arrangements that are applied is two. In other words, if the memory element has not been successfully programmed after the second iteration of step 640, the memory element is defective.

In the operational sequence 600 in FIG. 6, a relatively low voltage pulse is initially applied to establish the lower resistance state, and a higher voltage pulse is only applied when the lower voltage pulse is insufficient to program the memory element. In doing so, issues associated with applying an unnecessarily high voltage to the memory element are avoided.

Figure 7:
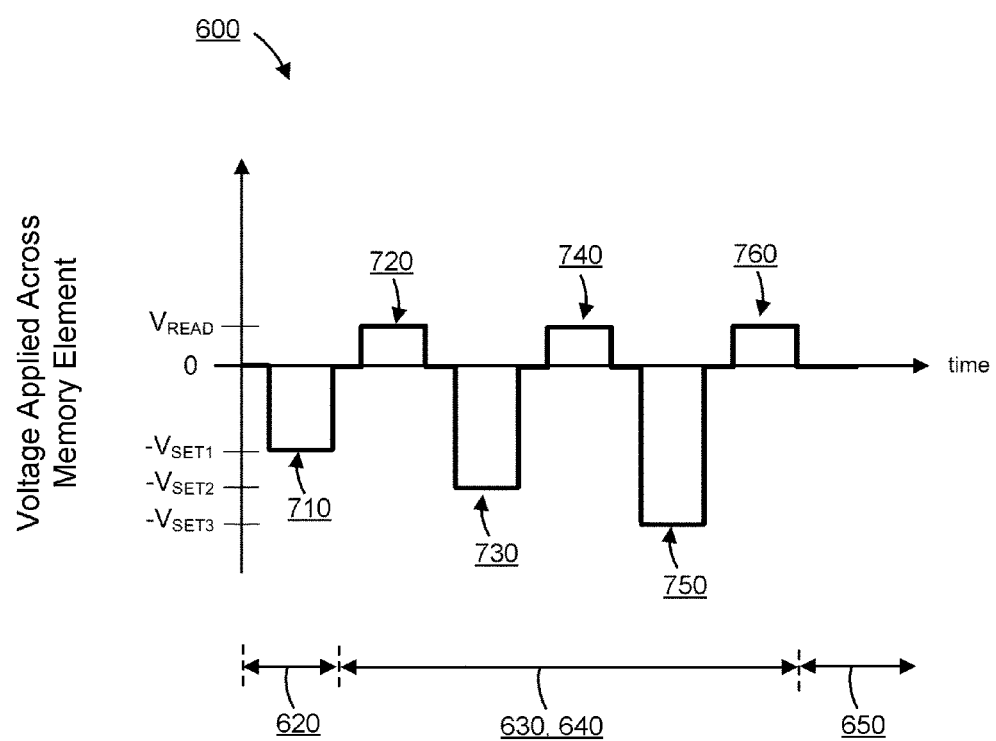
FIG. 7 illustrates an exemplary timing diagram of the operational sequence of FIG. 6.

FIG. 7 illustrates an exemplary timing diagram of the operational sequence of FIG. 6. The timing diagram of FIG. 7 is simplified and not necessarily to scale.

In the example illustrated in FIG. 7, the first set bias arrangement (step 620) comprises a first set voltage pulse 710 applied across the memory element. The first set voltage pulse 710 has a pulse height $V_{SET1}$ and has a negative voltage polarity across the memory element.

Next, a read bias arrangement is applied (step 630) to determine whether the memory cell has been programmed to the lower resistance state. In this example, the read bias arrangement comprises a read voltage pulse 720 having a pulse height $V_{READ}$ and a positive voltage polarity across the memory element.

In this example, the memory element has not been successfully programmed to the lower resistance state 510. As a result, a retry bias arrangement comprising a first retry voltage pulse 730 is applied across the memory element. The retry voltage pulse 730 has a pulse height $V_{SET2}$ and a negative voltage polarity across the memory element. As shown in FIG. 7, the pulse height $V_{SET2}$ of the first retry voltage pulse 730 is greater than the pulse height $V_{SET1}$ of pulse 710.

Next, a read bias arrangement comprising read voltage pulse 740 is applied to determine whether the memory element has been programmed to the lower resistance state.

In this example, the memory element has not been successfully programmed to the lower resistance state 510. As a result, a retry bias arrangement comprising a second retry voltage pulse 750 is applied across the memory element. The second voltage pulse 750 has a pulse height $V_{SET3}$ and a negative voltage polarity across the memory element. As shown in FIG. 7, the pulse height $V_{SET3}$ of pulse 750 is greater than the pulse height $V_{SET2}$ of pulse 730.

Next, a read bias arrangement comprising a read voltage pulse 760 is applied to determine whether the memory cell has been programmed to the lower resistance state. In this example, the voltage pulse 750 successfully programmed the memory cell to the lower resistance state. As a result, the operational sequence 600 ends (step 650).

In one embodiment, the pulses in FIG. 7 each have a pulse width of 50 ns, the pulse height $V_{SET1}$ is 1 Volt, pulse height $V_{SET2}$ is 1.05 Volts, pulse height $V_{SET3}$ is 1.1 Volts and pulse height $V_{READ}$ is 0.25 Volts. Other pulse widths and pulse heights may alternatively be used, and they can vary from embodiment to embodiment.

Figure 8A:
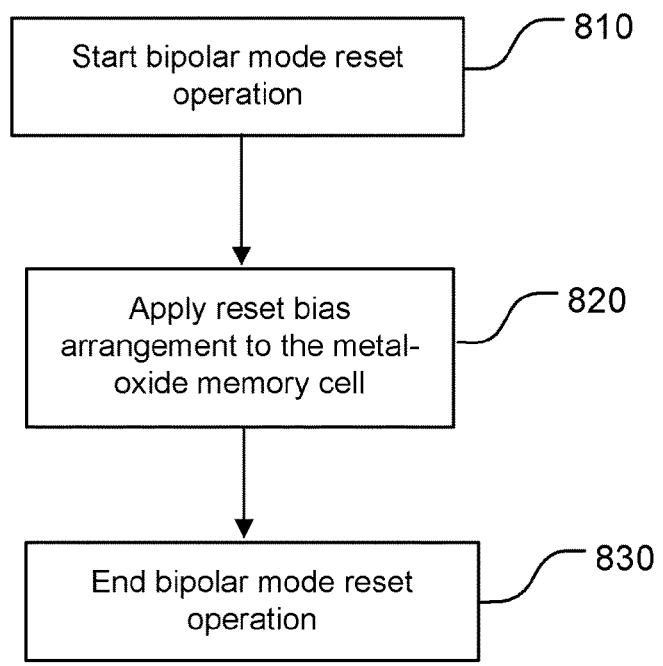
FIG. 8A is a flow chart of an operational sequence of a bipolar mode reset operation for programming a selected memory element from the lower resistance state to the higher resistance state.

FIG. 8A is a flow chart of an operational sequence 800 of a bipolar mode reset operation for programming a selected memory element from the lower resistance state 510 to the higher resistance state 500. The bipolar reset operation starts at step 610.

Next, at step 820 a reset bias arrangement is applied to establish the higher resistance state. The reset bias arrangement may include one or more pulses applied across the memory element. The number of pulse and the pulse characteristics, including the pulse heights and pulse widths, can be determined empirically for each embodiment. Next, at step 830 the operational sequence 800 ends.

In FIG. 8A, the operational sequence 800 does not include a program verify step to determine whether the reset bias arrangement of step 820 successfully programmed the memory element. In other words, no read operation is performed between applying the reset bias arrangement of step 820 and the beginning of a subsequent programming operation to change the resistance state of another memory element in the array. As described above with reference to FIG. 5B, the wide programming margin of the bipolar reset operation ensures that the memory elements can be reliably programmed to the higher resistance state.

Figure 8B:
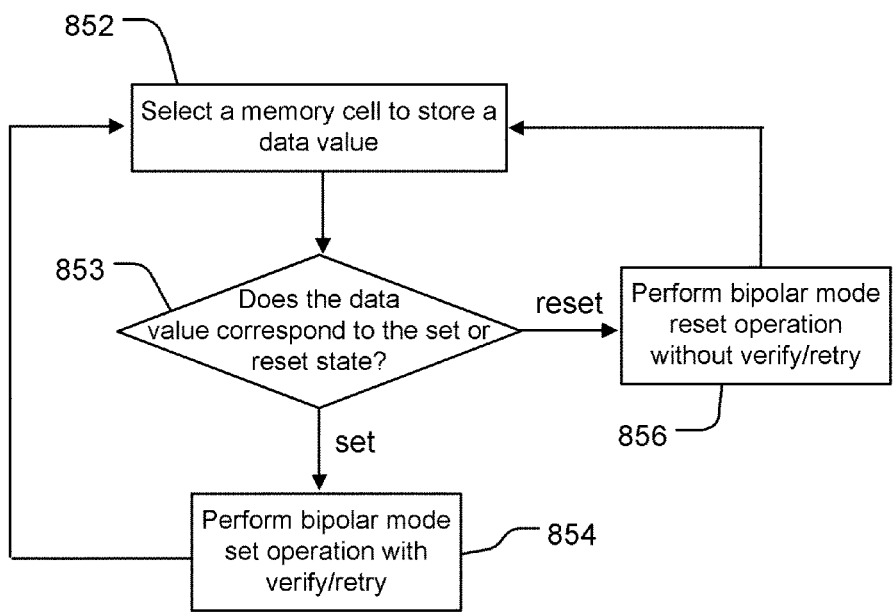
FIG. 8B is a flow chart of an operational programming process executed by the controller when operating in bipolar mode.

FIG. 8B is a flow chart of an operational programming process 850 executed by the controller 134 when operating in bipolar mode.

At step 852, a memory cell is selected to store a data value. The data value can be acquired from a buffer, or from other data sources internal or external to integrated circuit 110. The data value is associated with an address, which is decoded by the controller 134 to select the memory cell.

At step 853, the logic determines whether the data value corresponds to the lower resistance set state 510 or the higher resistance reset state 500 of the memory element of the selected memory cell.

If the data value corresponds to the lower resistance state 510 for the memory element of the selected memory cell, the process 850 continues to step 854. At step 854, the bipolar mode set operation with verify and high voltage retry is performed as described above with reference to FIG. 6.

If the data value corresponds to the higher resistance state 500, the process 850 continues to step 856. At step 856, the bipolar mode reset operation without verify/retry is performed as described above with reference to FIG. 8A.

Upon programming the data value in the selected memory cell, the process 850 returns to step 852. The process 850 is then repeated so that another memory cell can be selected and programmed.

Figure 9:
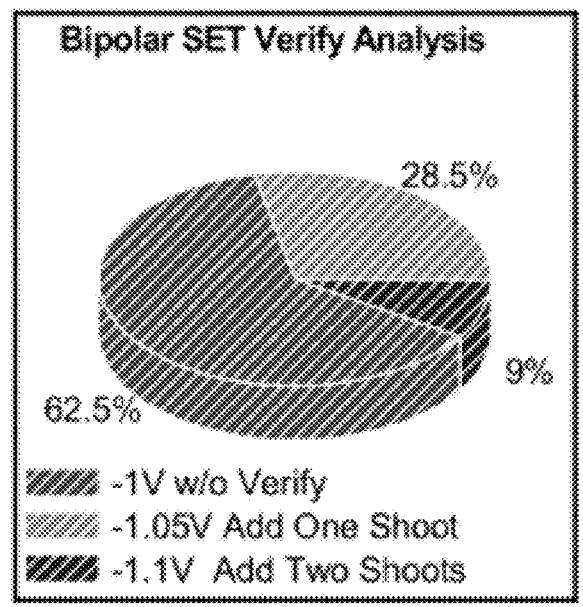
FIG. 9 is a pie chart showing the measured percentage of metal-oxide memory cells which required one, two or three programming bias arrangements to establish the lower resistance state when operating in bipolar mode.

FIG. 9 is a pie chart showing the measured percentage of metal-oxide memory elements which required one, two or three programming bias arrangements to establish the lower resistance state when operating in bipolar mode. In the measured results of FIG. 9, 62.5% of the memory elements were programmed after applying the first set bias arrangement, 28.5% of the memory elements required the application of one retry bias arrangement, and 9% of the memory elements required the application of two retry bias arrangements.

Figure 10:
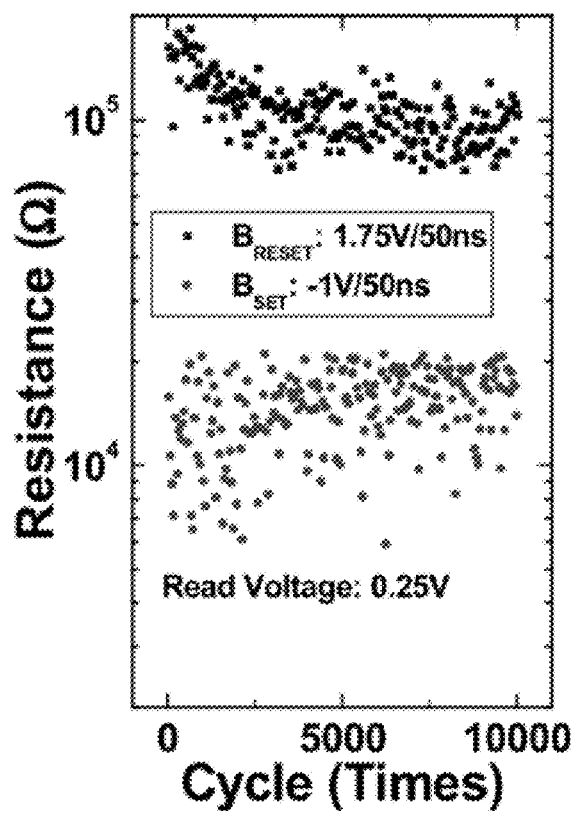
FIG. 10 is a plot of the measured resistance of a metal-oxide memory cell versus the number of cycles between the lower and higher resistance states when operating in bipolar mode.

FIG. 10 is a plot of the measured resistance of a metal-oxide memory element versus the number of cycles between the lower and higher resistance states when operating in bipolar mode. In the measured data, a first voltage pulse with a pulse height of 1 Volt with a negative voltage polarity and a pulse width of 50 ns was applied to establish the lower resistance set state. If the first voltage pulse was unsuccessful in establishing the lower resistance state, a second voltage pulse with a pulse height of 1.05 Volts with a negative voltage polarity and a pulse width of 50 ns was applied. If the second voltage pulse was unsuccessful, a third voltage pulse with a pulse height of 1.1 Volts and a pulse width of 50 ns was applied. As can be seen in FIG. 10, the bipolar operation described herein can provide excellent cycling endurance.

Unipolar Operation

Figure 11A:
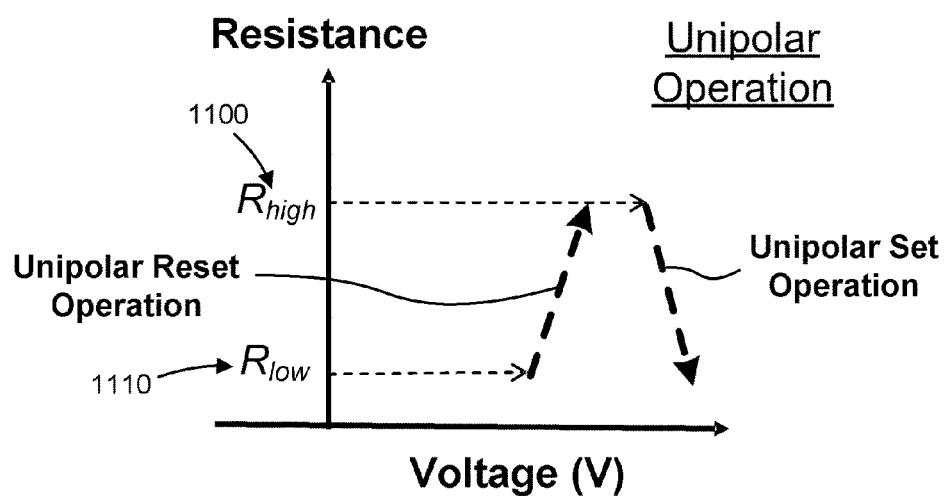
FIG. 11A illustrates a unipolar operation sequence for storing a one-bit data value in a metal-oxide memory cell.

FIG. 11A conceptually illustrates a unipolar operation sequence for storing a one-bit data value in a metal-oxide memory cell. In FIG. 11A the memory element is programmable to a lower resistance set state ($R_{low}$) 1110 and a higher resistance reset state ($R_{high}$) 1100. In some embodiments the memory element may be programmable to one or more additional resistance states.

As represented by the arrows in FIG. 11A, programming operations are performed on the memory cell to change resistance state of the memory element between the lower resistance state 1110 and the higher resistance state 1100. As shown in FIG. 11A, a reset operation involves applying a positive voltage across the memory element to change the resistance from the lower resistance state 1110 and the higher resistance state 1100. A set operation involves applying a negative voltage across the memory element to change the resistance from the higher resistance state 1100 to the lower resistance state 1110. As shown in FIG. 11A, the voltage applied in the reset operation is the same polarity as the voltage applied in the set operation. In this example, both operations apply positive voltages across the memory element. Alternatively, both operations can apply negative voltages across the memory element.

Figure 11B:
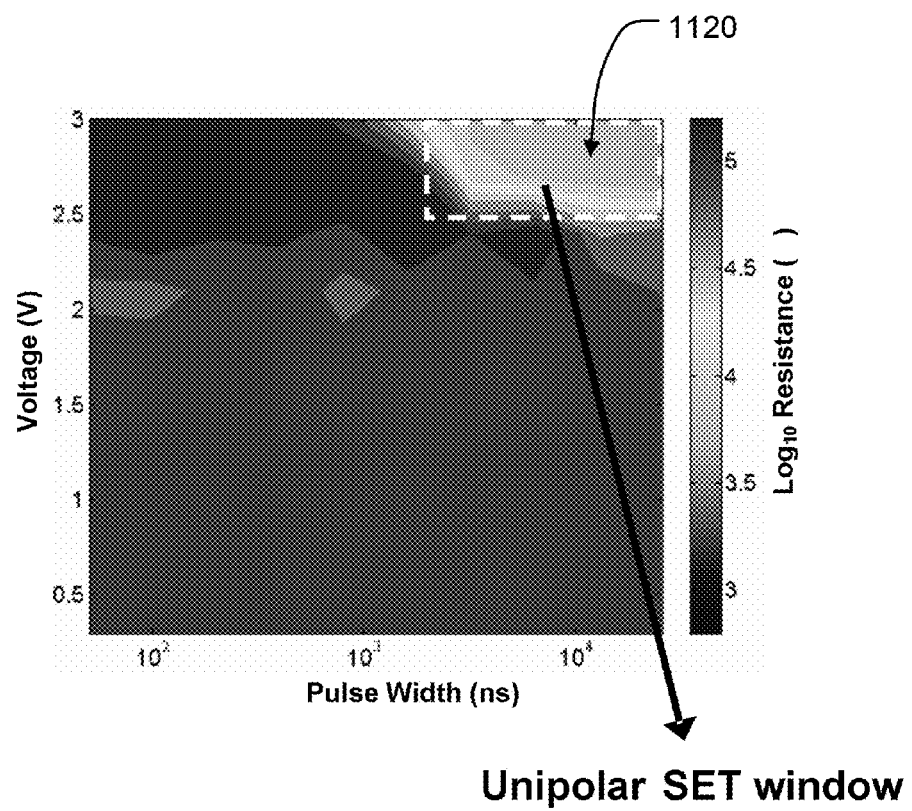
FIG. 11B is a Shmoo plot of the measured resistance of a metal-oxide memory element in response to pulses having various pulse characteristics.

FIG. 11B is a Shmoo plot of the measured resistance of a metal-oxide memory element in response to pulses having various pulse characteristics. In FIG. 11B, the pulse widths of the applied pulses were varied over the range of {50, 100, 200, . . . , 25600 ns} and the pulse heights were varied over the range {0.3, 0.6, 0.9, . . . , 3 Volts}. In the data in FIG. 11B, the initial resistance state is a higher resistance reset state having a resistance of about 100 Kohm. In between applied pulses, the initial higher resistance reset state was established by performing an appropriate reset operation.

As shown in FIG. 11B, a subset of the applied pulses having characteristics within region 1120 are shown to successfully induce a change from the initial higher resistance reset state 1100 to the desired lower resistance set state 1110. The characteristics of the applied pulses within region 1120 are referred to herein as the unipolar set window.

Figure 11C:
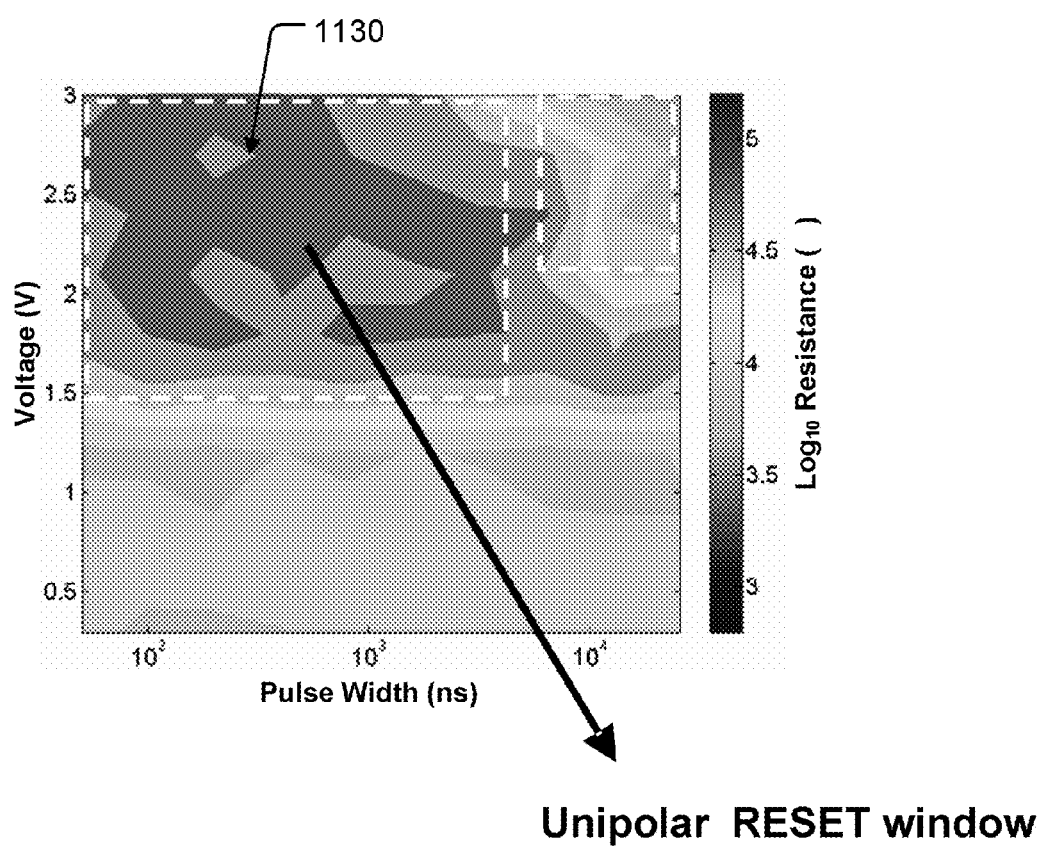
FIG. 11C is a Shmoo plot of the measured resistance of a metal-oxide memory element in response to pulses having various pulse characteristics.

FIG. 11C is a Shmoo plot of the measured resistance of a metal-oxide memory element in response to pulses having various pulse characteristics. The pulse widths of the applied pulses were varied over the range of {50, 100, 200, . . . , 25600 ns} and the pulse heights were varied over the range {0.3, 0.6, 0.9, . . . , 3 Volts}. In the data in FIG. 11C, the initial resistance state is a lower resistance set state having a resistance of less than or equal to about 10 Kohm. In between applied pulses, the initial lower resistance set state was established by performing an appropriate set operation.

As shown in FIG. 11C, a subset of the applied pulses having characteristics within region 1130 are shown to successfully induce a change from the initial low resistance set state 1110 to the desired higher resistance reset state 1100. The characteristics of the applied pulses within region 1130 are referred to herein as the unipolar reset window.

As can be seen in FIG. 1B, the resistance of the metal-oxide memory element within the unipolar set window (given by region 1120) varies gradually as a function of the applied pulse height. In other words, the unipolar set operation has a wide programming margin over which the resistance of the memory element is relatively insensitive to the applied pulse height. This wide programming margin ensures that the memory elements can be reliably programmed to the lower resistance state 1110, without the need to perform a program verify step.

In contrast, as can be seen upon comparison of FIGS. 11B and 11C, the resistance of the metal-oxide memory element within the unipolar reset window (given by region 1130) varies more rapidly as a function of the applied pulse height. In other words, the unipolar reset operation has a relatively small programming margin. As a result, unipolar reset operations described herein include one or more program verify steps to ensure the memory element has been properly reset to the higher resistance reset state 1100.

Figure 12:
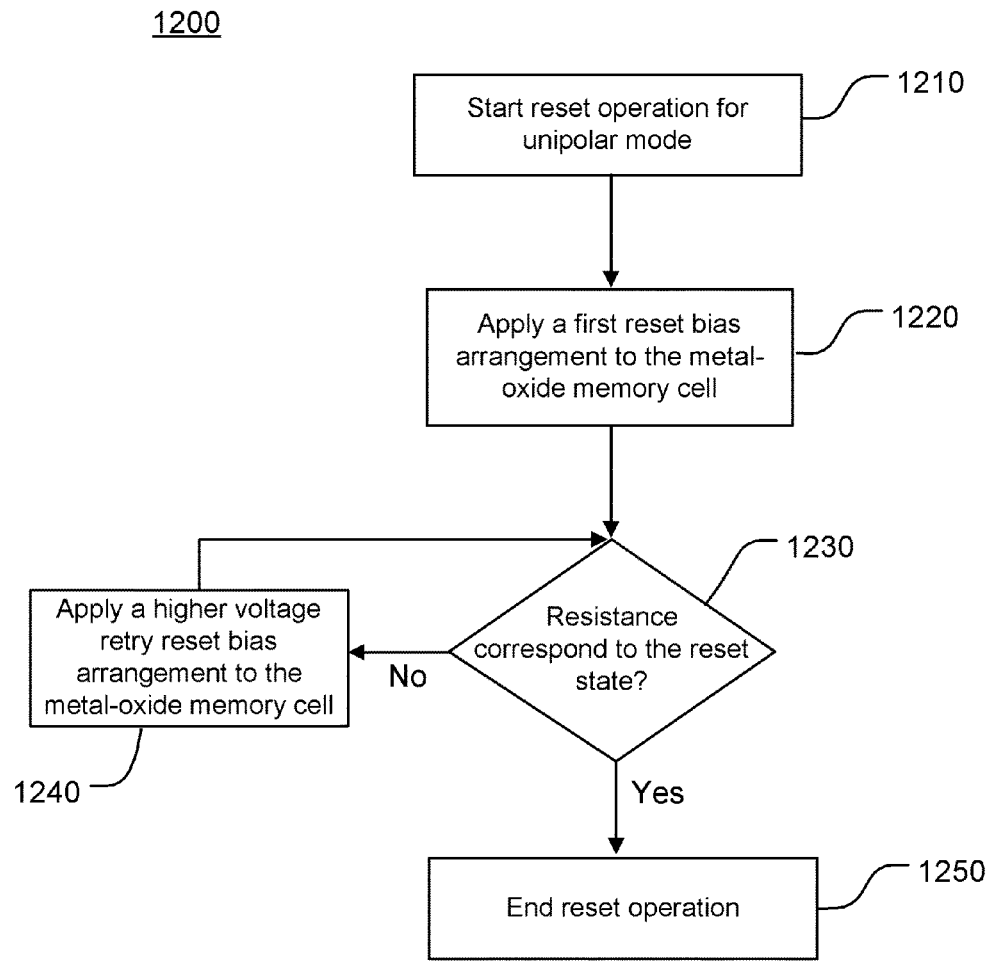
FIG. 12 is a flow chart of an operational sequence of a reset operation including verification and high voltage retry when operating in bipolar mode.

FIG. 12 is a flow chart of an operational sequence 1200 of a unipolar mode reset operation for programming a selected memory cell from the lower resistance state to the higher resistance state. The sequence begins at step 1210.

Next, at step 1220 a first reset bias arrangement is applied to the memory cell to establish the higher resistance state. In this example, the first reset bias arrangement is a first voltage pulse having a first pulse height applied across the memory element. Alternatively, the first reset bias arrangement may include more than one pulse.

Next, at step 1240 the resistance of the memory element is read to determine whether the memory element has been programmed to the higher resistance state 1100. If the memory element is not in the higher resistance state 1100, a higher voltage retry reset bias arrangement is applied to the memory cell at step 640. The retry reset bias arrangement comprises a voltage pulse having a pulse height across the memory element which is greater than the pulse height of the voltage pulse applied at step 1220.

The operational sequence 1200 continues in the loop of steps 1240, 1230, until the memory element has been successfully programmed, or until a predetermined number of retries are made. In this example, the pulse height of the retry reset bias arrangement applied across the memory element is increased between each iteration of step 1240. If in step 1230 it is determined that the memory element has successfully been programmed to the lower resistance state, the operational sequence 1200 ends at step 1250.

Figure 13:
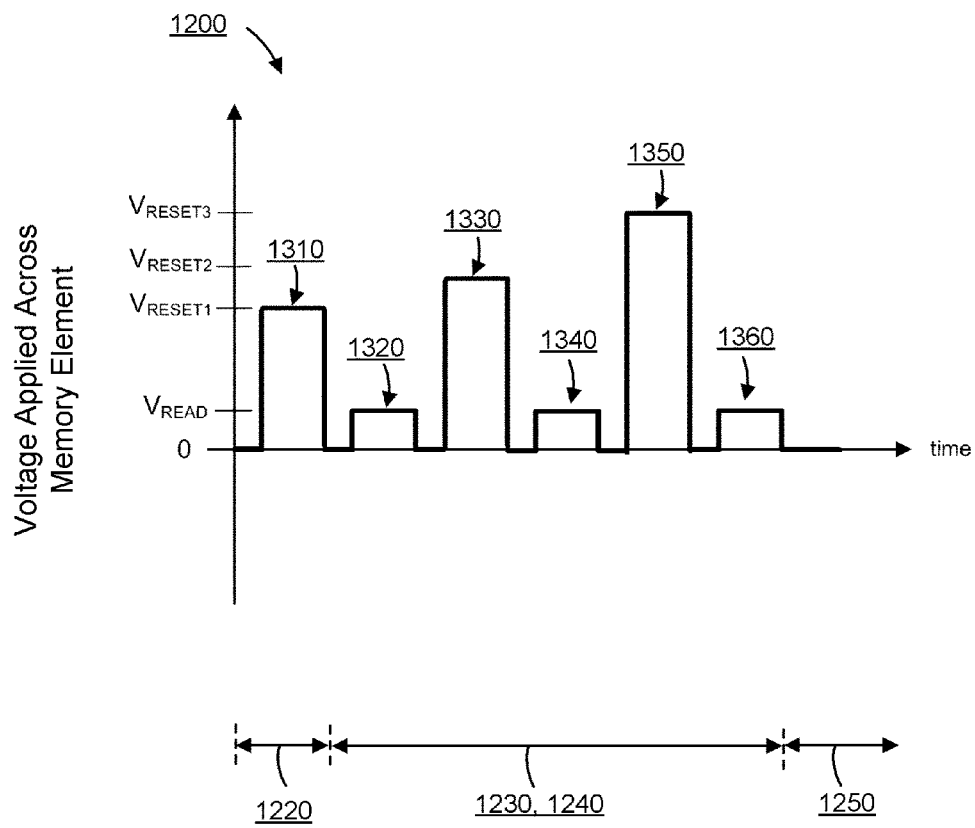
FIG. 13 illustrates an exemplary timing diagram of the reset operation of FIG. 11.

FIG. 13 illustrates an exemplary timing diagram of the operational sequence of FIG. 12. The timing diagram of FIG. 13 is simplified and not necessarily to scale.

In the example illustrated in FIG. 13, the first reset bias arrangement (step 1220) comprises a first reset voltage pulse 1310 applied across the memory element. The first reset voltage pulse 1310 has a pulse height $V_{RESET1}$ and has a positive voltage polarity across the memory element in this example.

Next, a read bias arrangement is applied (step 1320) to determine whether the memory element has been programmed to the higher resistance state 1100. In this example, the read bias arrangement comprises a read voltage pulse 1320 having a pulse height $V_{READ}$ and a positive voltage polarity across the memory element.

In this example, the memory element has not been successfully programmed to the higher resistance state 1100. As a result, a retry reset bias arrangement comprising a first retry voltage pulse 1330 is applied (step 640) across the memory element. The voltage pulse 1330 has a pulse height $V_{RESET3}$ and a positive voltage polarity across the memory element. As shown in FIG. 13, the pulse height $V_{RESET2}$ of pulse 1330 is greater than the pulse height $V_{RESET1}$ of pulse 1310.

Next, a read bias arrangement comprising read voltage pulse 1340 is applied to determine whether the memory element has been programmed to the higher resistance state.

In this example, the memory element has not been successfully programmed to the higher resistance state 1100. As a result, a retry bias arrangement comprising a second retry voltage pulse 1350 is applied (step 1240) across the memory element. The second retry voltage pulse 1350 has a pulse height $V_{RESET3}$ and a positive voltage polarity across the memory element. As shown in FIG. 13, the pulse height $V_{RESET3}$ of pulse 1350 is greater than the pulse height $V_{RESET2}$ of pulse 1330.

Next, a read bias arrangement comprising a read voltage pulse 1360 is applied to determine whether the memory element has been successfully programmed. In this example, the voltage pulse 1350 successfully programmed the memory cell to the higher resistance state 1100. As a result, the operational sequence 600 ends (step 650).

In one embodiment, the predetermined of reset bias arrangements that are applied is four. In one example, each of the pulses have a pulse width of 50 ns. The pulse height $V_{RESET1}$ applied at step 1220 is 2.2 Volts, and the pulse height applied at retry step 1240 is increased from an initial first pulse height of 2.4 Volts in an increment of 0.2 Volts between each iteration of step 1240. Other pulse widths and pulse heights may alternatively be used.

Figure 14A:
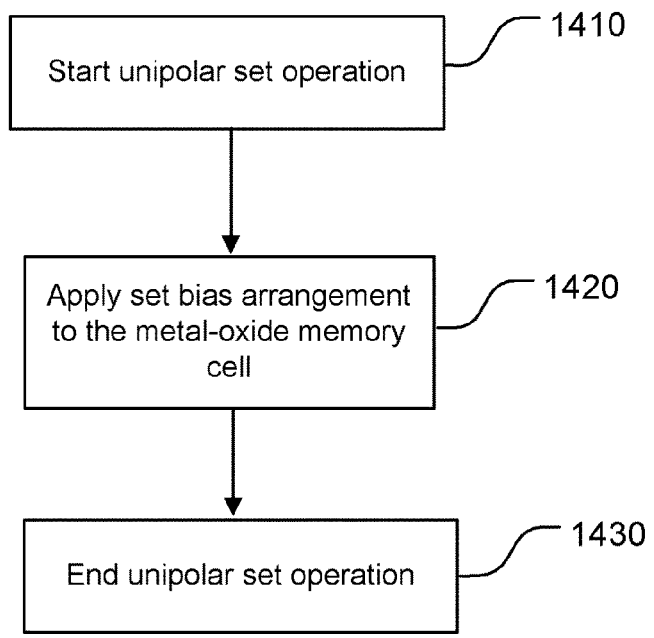
FIG. 14A is a flow chart of an operational sequence of a unipolar mode set operation for programming a selected memory cell from the higher resistance state to the lower resistance state.

FIG. 14A is a flow chart of an operational sequence 1400 of a unipolar mode set operation for programming a selected memory cell from the higher resistance state 1100 to the lower resistance state 1110. The unipolar reset operation starts at step 1410.

Next, at step 1420 a set bias arrangement is applied to the memory cell to establish the lower resistance state. The set bias arrangement may include one or more pulses applied across the memory element. The number of pulses and their pulse characteristics, including the pulse heights and pulse widths, can be determined empirically for each embodiment. Next, at step 1430 the operational sequence 1400 ends.

In FIG. 14A, the operational sequence 1400 does not include a program verify step to determine whether the set bias arrangement of step 1420 successfully programmed the memory element. In other words, no read operation is performed between applying the set bias arrangement of step 1220 and the beginning of a subsequent programming operation to change the resistance state of another memory element in the array. As described above with reference to FIG. 11B, the wide programming margin of the unipolar set operation ensures that the memory elements can be reliably programmed to the higher resistance state.

Figure 14B:
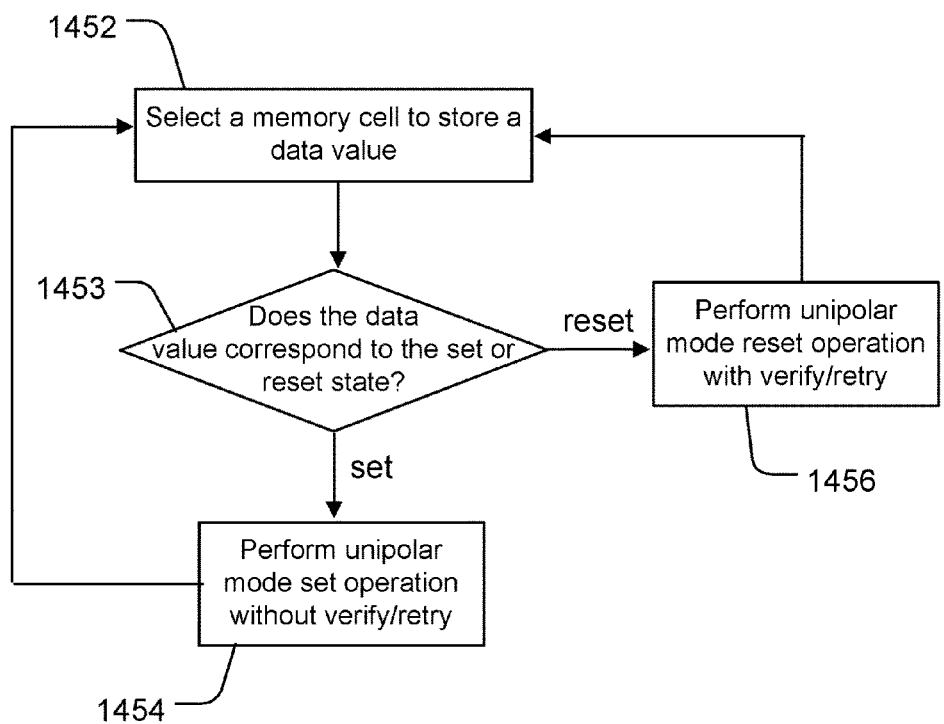
FIG. 14B is a flow chart of an operational programming process executed by the controller when operating in unipolar mode.

FIG. 14B is a flow chart of an operational programming process 850 executed by the controller 134 when operating in unipolar mode.

At step 1452, a memory cell is selected to store a data value. The data value can be acquired from a buffer, or from other data sources internal or external to integrated circuit 110.

At step 1453, the logic determines whether the data value corresponds to the lower resistance set state 1110 or the higher resistance reset state 1000 of the memory element of the selected memory cell.

If the data value corresponds to the lower resistance state 1110 for the memory element of the selected memory cell, the process 1450 continues to step 1454. At step 1454, the unipolar mode set operation without verify/retry is performed as described above with reference to FIG. 14A.

If the data value corresponds to the higher resistance state 1100, the process 1450 continues to step 1456. At step 1456, the unipolar mode reset operation with verify and high voltage retry is performed as described above with reference to FIG. 12.

Upon programming the data value in the selected memory cell, the process 1450 returns to step 1452. The process 1450 is then repeated so that another memory cell can be selected and programmed.

Figure 15:
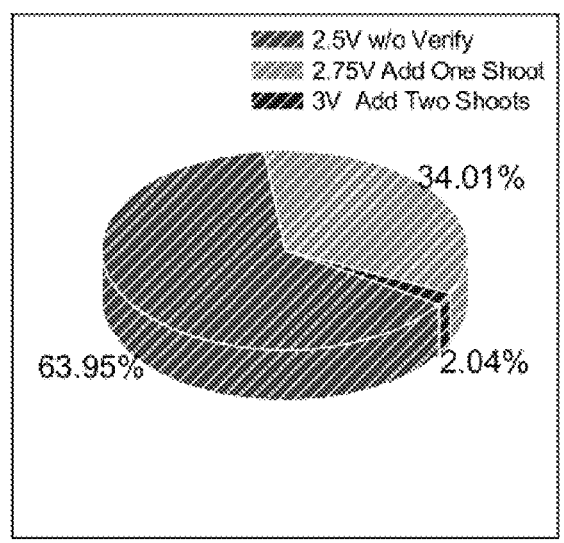
FIG. 15 is a pie chart showing the measured percentage of metal-oxide memory cells which required one, two, three, four or five programming bias arrangements to establish the reset state when operating in unipolar mode.
Figure 16:
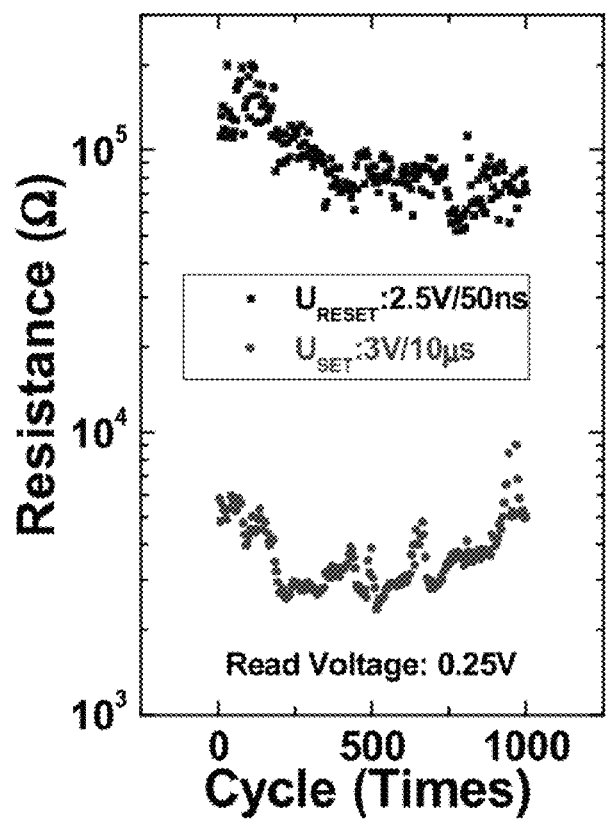
FIG. 16 is a plot of the measured resistance of a metal-oxide memory cell versus the number of cycles between the set and reset states when operating in unipolar mode.

FIG. 15 is a pie chart showing the measured percentage of metal-oxide memory elements which required one, two or three bias arrangements to establish the higher resistance state when operating in unipolar mode. In the measured results of FIG. 15, 63.95% of memory elements were programmed after applying the first reset bias arrangement of step 1220, 34.01% required the application of one retry bias arrangement and 2.04% required two retry bias arrangements FIG. 16 is a plot of the measured resistance of a metal-oxide memory element versus the number of cycles between the lower and higher resistance states when operating in unipolar mode. In the measured results of FIG. 16, a voltage pulse with a pulse height of 3 Volts with a positive voltage polarity and a pulse width of 10 µs was applied to establish the lower resistance set state. A voltage pulse with a pulse height of 2.5 Volts with a positive voltage polarity and a pulse width of 50 ns was applied to establish the higher resistance reset state. As can be seen in FIG. 16, the unipolar operation described herein can provide excellent cycling endurance.

Figure 17:
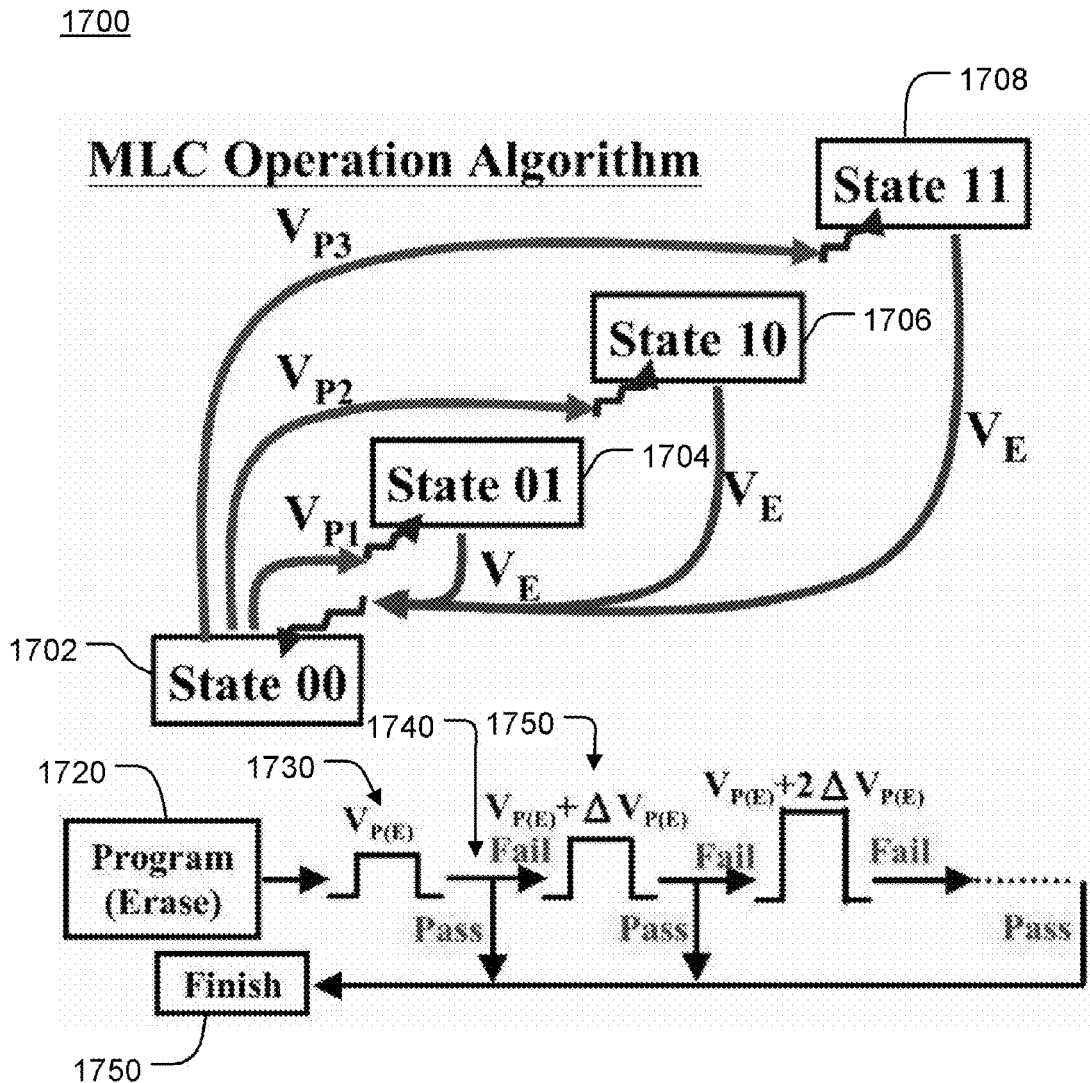
FIG. 17 illustrates an example flow diagram of an operational programming process executed by the controller during multi-bit operation.

The techniques describe herein can also be implemented to operate multi-bit metal-oxide memory elements programmable to more than two resistance states. FIG. 17 illustrates an example flow diagram of an operational programming process 1700 executed by the controller 134 during multi-bit operation. In FIG. 17, four resistance states 1702, 1704, 1706 and 1708 are illustrated, resulting in the memory cell storing two bits of data.

Each of the resistance states 1702, 1704, 1706 and 1708 correspond to a non-overlapping resistance range of the memory cell. In FIG. 17, state 1702 corresponding to the low resistance state, and state 1708 corresponds to the high resistance state. As represented by the arrows in FIG. 17, respective programming pulses $V_{P1}$, $V_{P2}$, $V_{P3}$ with verify operations are performed to change the change the resistance state of the memory element from the lower resistance state 1702 to each of the higher resistance states 1704, 1706 and 1708. The pulse voltages can be different for each of the programming operations $V_{P1}$, $V_{P2}$, $V_{P3}$. Pulse voltages and durations can be determined empirically for each embodiment.

As shown by the arrows in FIG. 17, in this example the operation sequence includes applying an erase pulse having a voltage $V_E$ to return to the lower resistance state 1702, prior to changing to one of the higher resistance states 1704, 1706 and 1708. For example, changing the resistance state of the metal-oxide memory element from state 1708 to state 1708 involves applying an erase pulse (voltage $V_E$) to induce a change from state 1708 to state 1702, followed by a programming operation V$_{P2}$ to induce a change from state 1702 to state 1706.

Also shown in FIG. 17 is a flow diagram of a program (or erase) operation with verify when operating in multi-bit mode. The program operation begins at step 1720. At step 1730, a first programming bias arrangement is applied to change the metal-oxide memory element to the desired resistance state. At step 1740, a read operation is performed to determine whether the memory element has been programmed to the desired resistance state. If the memory element has been programmed to the desired resistance state, the programming operation ends at step 1750. If, however, the memory element has not been programmed to the desired resistance state, the operation continues to step 1750.

At step 1750, a higher voltage retry programming operation is performed. The higher voltage retry programming operation comprises a voltage pulse having a pulse height across the memory element which is greater than the pulse height of the voltage pulse applied at step 1730. The operation then continues in the sequence of performing a read operation and, if read fails, a higher voltage retry programming operations, until the memory element has been successfully programmed, or until a predetermined number of retries are made.

Figure 18:
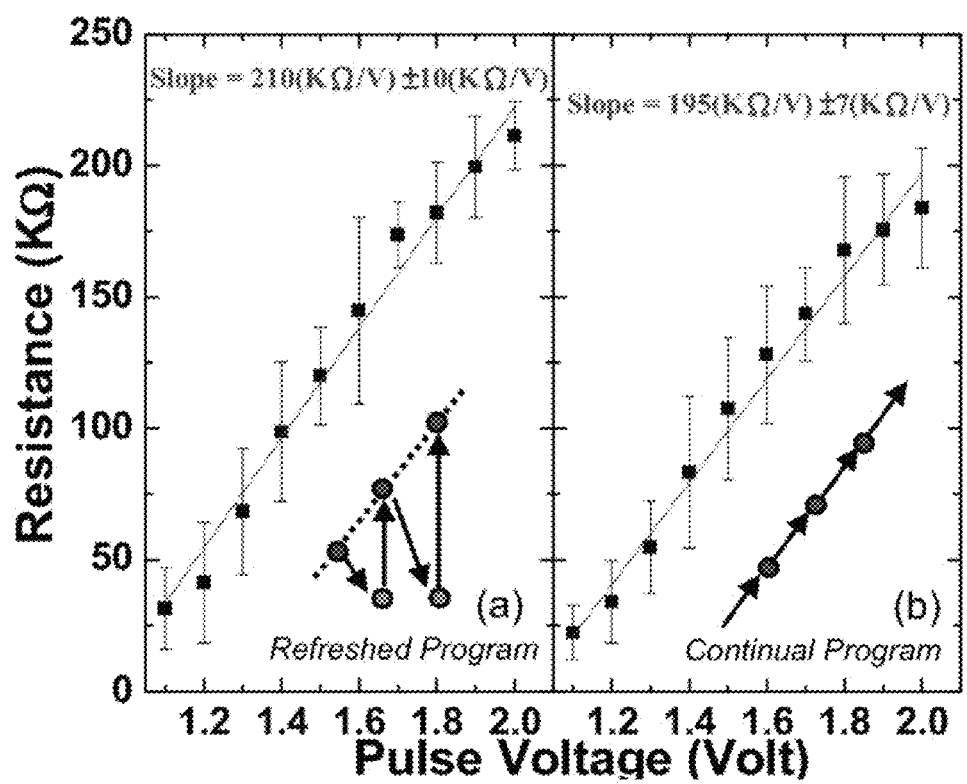
FIG. 18 is a plot of the measured resistance of a metal-oxide memory element versus programming pulse voltage when operating in multi-bit mode.

FIG. 18 is a plot of the measured resistance of a metal-oxide memory element versus programming pulse voltage when operating in multi-bit mode. The left plot (a) in FIG. 18 is the measured resistance during an operation sequence which involves performing an erase operation to return to the lower resistance state, between the application of the programming pulse. The right plot (b) in FIG. 18 is the measured resistance during an operation sequence which involves sequentially applying higher pulse voltages to increase the resistance, without returning to the lower resistance state between pulses. As can be seen upon comparison of plot (a) and (b), the change in the resistance of the memory cell depends on the voltage of the applied pulse, rather than the previous state of the memory element.

Figure 19:
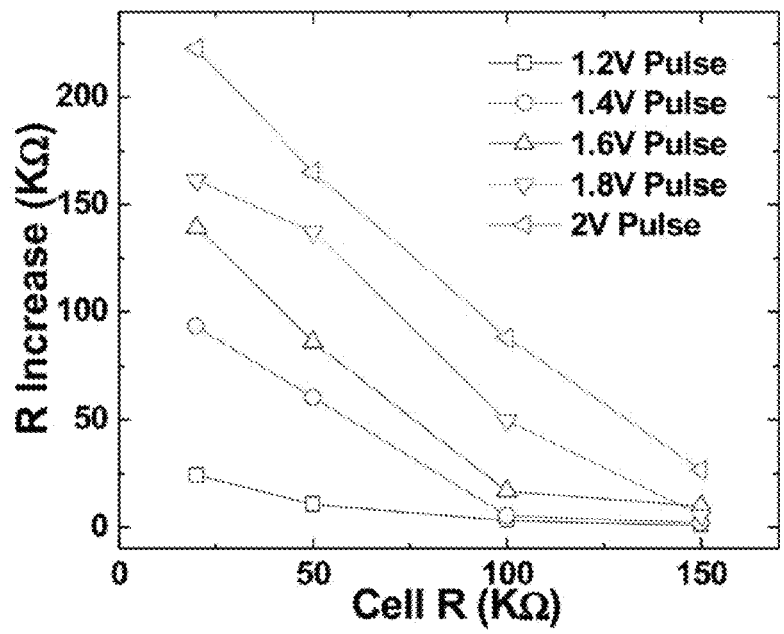
FIG. 19 is a plot of the measured increase in the resistance of a metal-oxide memory element versus the initial resistance for various program pulse voltages.

FIG. 19 is a plot of the measured increase in the resistance of a metal-oxide memory element versus the initial resistance for various program pulse voltages having pulse widths of 50 ns. As can be seen in FIG. 19, the increase in resistance for a given initial resistance value is proportional to the pulse voltage. In addition, the increase in resistance is inversely proportional to the initial resistance. This provides self-limiting convergence of the resistance of the highest resistance state for the memory element.

Figure 20:
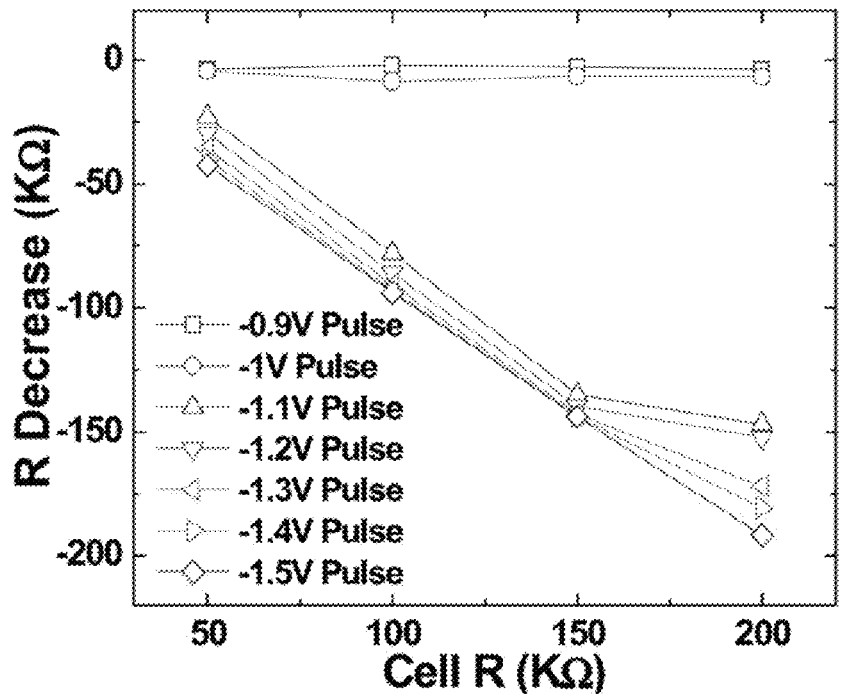
FIG. 20 is a plot of the measured decrease in the resistance of a metal-oxide memory element versus the initial resistance for various erase pulse voltages.

FIG. 20 is a plot of the measured decrease in the resistance of a metal-oxide memory element versus the initial resistance for various erase pulse voltages. As can be seen in FIG. 20, for pulse voltages with a magnitude of 1.1 Volts and above, the decrease in resistance is largely independent of the pulse voltage. In addition, the decrease in resistance is directly proportional to the initial resistance. As a result, applying an erase pulse with a magnitude of 1.1 Volts and above will induce a change to the lowest resistance state, regardless of the initial resistance state of the memory element.

Figure 21:
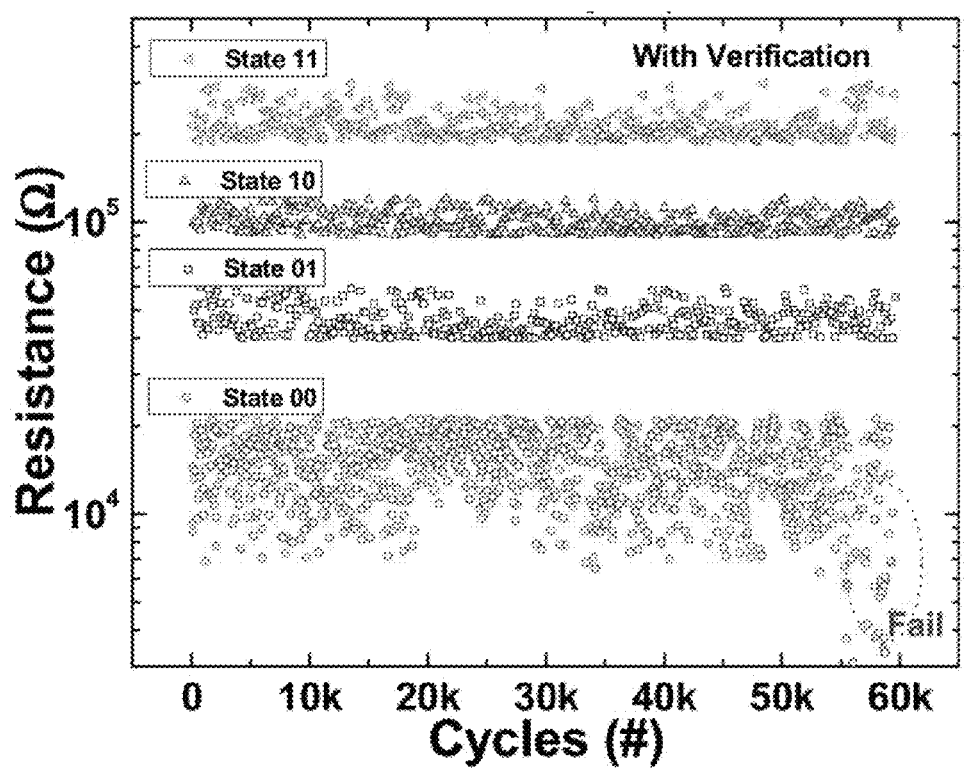
FIG. 21 is a plot of the measured resistance of a metal-oxide memory element storing two-bits of data versus the number of cycles.

FIG. 21 is a plot of the measured resistance of a metal-oxide memory element storing two-bits of data versus the number of cycles. A voltage pulse with a pulse height of 1.1 Volts with a positive voltage polarity and a pulse width of 50 ns was applied to establish state 01. A voltage pulse with a pulse height of 1.3 Volts with a positive voltage polarity and a pulse width of 50 ns was applied to establish state 10. A voltage pulse with a pulse height of 1.6 Volts with a positive voltage polarity and a pulse width of 50 ns was applied to establish state 10. The retry voltage was increased by an increment of 0.1 Volts between each iteration of a high voltage program retry step.

Figure 22:
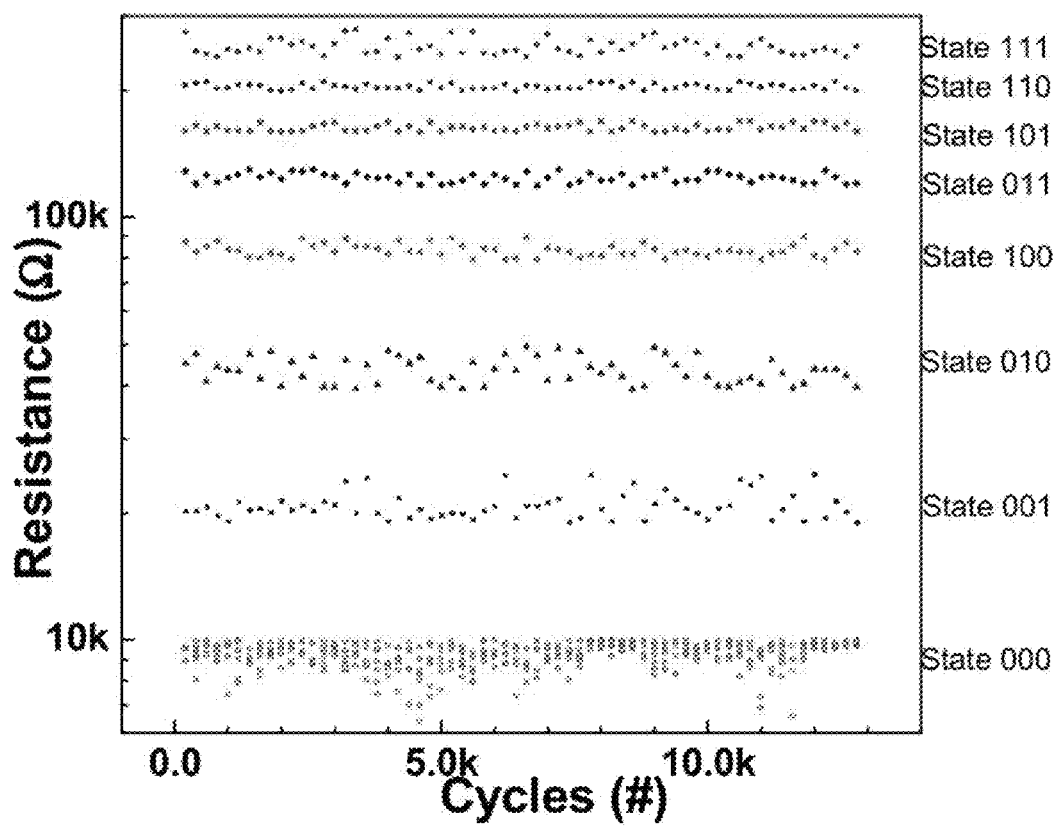
FIG. 22 is a plot of the measured resistance of a metal-oxide memory element storing three-bits of data versus the number of cycles.

FIG. 22 is a plot of the measured resistance of a metal-oxide memory element storing three-bits of data versus the number of cycles. A program voltage pulse with a pulse height of 1.0 Volts with a positive voltage polarity and a pulse width of 50 ns was used to obtain the data in FIG. 22. The retry voltage was increased by an increment of 0.1 Volts between each iteration of a high voltage program retry step.

As can be seen in FIGS. 21 and 22, the multi-bit operation described herein can provide excellent cycling endurance.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device comprising:
   a metal-oxide memory element programmable to a plurality of resistance states; and
   a controller including logic to apply bias arrangements to the metal-oxide memory element, the bias arrangements including:
      a first bias arrangement to establish a first resistance state in the plurality of resistance states, the first bias arrangement comprising a first voltage pulse; and
      a second bias arrangement to establish the first resistance state if the memory element is not in the first resistance state after applying the first bias arrangement, the second bias arrangement comprising a second voltage pulse having a pulse height across the metal-oxide memory element which is greater than that of the first voltage pulse, wherein the first resistance state corresponds to a resistance value higher than that of a second resistance state in the plurality of resistance states, and the bias arrangements further include:
   a third bias arrangement to change the resistance state from the first resistance state to the second resistance state, the third bias arrangement comprising a third voltage pulse having a voltage polarity across the metal-oxide memory element the same as that of the first and second voltage pulses.

2. The memory device of claim 1, wherein the logic applies the third bias arrangement during a programming operation which does not include a program-verify step.

3. The memory device of claim 1, wherein the metal-oxide memory element comprises tungsten-oxide.

4. The memory device of claim 1, wherein the bias arrangements further include:
   a fourth bias arrangement to change the resistance state from the second resistance state to a third resistance state.

5. A memory device comprising:
   a metal-oxide memory element programmable to a plurality of resistance states; and
   a controller including logic to apply bias arrangements to the metal-oxide memory element, the bias arrangements including:
      a first bias arrangement to establish a first resistance state in the plurality of resistance states, the first bias arrangement comprising a first voltage pulse; and
      a second bias arrangement to establish the first resistance state if the memory element is not in the first resistance state after applying the first bias arrangement, the second bias arrangement comprising a second voltage pulse having a pulse height across the metal-oxide memory element which is greater than that of the first voltage pulse, wherein the first resistance state corresponds to a resistance value lower than that of a second resistance state in the plurality of resistance states, and the bias arrangements further include:
a third bias arrangement to change the resistance state from the first resistance state to the second resistance state, the third bias arrangement comprising a third voltage pulse having a voltage polarity across the metal-oxide memory element which is opposite that of the first and second voltage pulses.

6. The memory device of claim 5, wherein the logic applies the third bias arrangement during a programming operation which does not include a program-verify step.

7. The memory device of claim 5, wherein the controller further includes logic to iteratively apply subsequent bias arrangements to establish the first resistance state and read the resistance state of the memory element, the subsequent bias arrangements applied until the memory element is in the first resistance state or a predetermined number of retries are made, wherein the subsequent bias arrangements respectively comprise a corresponding voltage pulse having a pulse height across the metal-oxide memory element greater than that of the first voltage pulse.

8. The memory device of claim 5, wherein the metal-oxide memory element comprises tungsten-oxide.

9. The memory device of claim 5, wherein the bias arrangements further includes:
a fourth bias arrangement to change the resistance state from the second resistance state to a third resistance state.

10. A method for operating a metal-oxide memory element programmable to a plurality of resistance states, the method comprising:
applying a first bias arrangement to the metal-oxide memory element to establish a first resistance state in the plurality of resistance states, the first bias arrangement comprising a first voltage pulse;
determining whether the metal-oxide memory element is in the first resistance state after applying the first bias arrangement; and
if the memory element is not in the first resistance state, then applying a second bias arrangement to the metal-oxide memory element to establish the first resistance state, the second bias arrangement comprising a second voltage pulse having a pulse height across the metal-oxide memory element greater than that of the first voltage pulse, wherein the first resistance state corresponds to a resistance value higher than that of a second resistance state in the plurality of resistance states, and further comprising:
applying a third bias arrangement to the metal-oxide memory element to change the resistance state from the first resistance state to the second resistance state, the third bias arrangement comprising a third voltage pulse having a voltage polarity across the metal-oxide memory element which is the same as that of the first and second voltage pulses.

11. The method of claim 10, further comprising performing a programming operation to change the resistance state of the memory element after applying the third bias arrangement, wherein no verify operation is performed between applying the third bias arrangement and performing the programming operation.

12. The method of claim 10, wherein if the memory element is not in the first resistance state after applying the second bias arrangement, iteratively applying subsequent bias arrangements to the memory element until the memory element is in the first resistance state or a predetermined number of retries are made, wherein the subsequent bias arrangements respectively comprise a corresponding voltage pulse having a pulse height greater than that of the first voltage pulse.

13. The method of claim 10, wherein the metal-oxide memory element comprises tungsten-oxide.

14. The method of claim 10, further including
applying a fourth bias arrangement to change the resistance state from the second resistance state to a third resistance state.

15. A method for operating a metal-oxide memory element programmable to a plurality of resistance states, the method comprising:
applying a first bias arrangement to the metal-oxide memory element to establish a first resistance state in the plurality of resistance states, the first bias arrangement comprising a first voltage pulse;
determining whether the metal-oxide memory element is in the first resistance state after applying the first bias arrangement; and
if the memory element is not in the first resistance state, then applying a second bias arrangement to the metal-oxide memory element to establish the first resistance state, the second bias arrangement comprising a second voltage pulse having a pulse height across the metal-oxide memory element greater than that of the first voltage pulse, wherein the first resistance state corresponds to a resistance value lower than that of a second resistance state in the plurality of resistance states, and further comprising:
applying a third bias arrangement to the metal-oxide memory element to change the resistance state from the first resistance state to the second resistance state, the third bias arrangement comprising a third voltage pulse having a voltage polarity across the metal-oxide memory element opposite that of the first and second voltage pulses.

16. The method of claim 15, further comprising performing a programming operation to change the resistance state of the memory element after applying the third bias arrangement, wherein no verify operation is performed between applying the third bias arrangement and performing the programming operation.

17. The method of claim 15, wherein if the memory element is not in the first resistance state after applying the second bias arrangement, iteratively applying subsequent bias arrangements to the memory element until the memory element is in the first resistance state or a predetermined number of retries are made, wherein the subsequent bias arrangements respectively comprise a corresponding voltage pulse having a pulse height greater than that of the first voltage pulse.

18. The method of claim 15, wherein the metal-oxide memory element comprises tungsten-oxide.

19. The method of claim 15, further comprising:
applying a fourth bias arrangement to change the resistance state from the second resistance state to a third resistance state.

20. A memory device comprising:
a memory cell including a metal-oxide memory element programmable to a plurality of resistance states; and a controller including logic operable to program a selected memory cell to a data value to:
  determine if the data value corresponds to a first resistance state or a second resistance state of the metal-oxide memory element;
  perform a first program operation with verify if the data value corresponds to the first resistance state; and
  perform a second program operation without verify if the data value corresponds to the second resistance state, wherein:
the first resistance state corresponds to a resistance value lower than that of the second resistance state;
the logic to perform a first program operation applies a first voltage pulse across the metal-oxide memory element; and
the logic to perform a second program operation applies a second voltage pulse across the metal-oxide memory element, the second voltage pulse having a voltage polarity opposite that of the first voltage pulse.

21. The memory device of claim 20, wherein the memory cell is a multibit cell, and the controller includes logic to perform program operations for at least one additional resistance state.

22. A memory device comprising:
a memory cell including a metal-oxide memory element programmable to a plurality of resistance states; and
a controller including logic operable to program a selected memory cell to a data value to:
  determine if the data value corresponds to a first resistance state or a second resistance state of the metal-oxide memory element;
  perform a first program operation with verify if the data value corresponds to the first resistance state; and
  perform a second program operation without verify if the data value corresponds to the second resistance state, wherein:
the first resistance state corresponds to a resistance value greater than that of the second resistance state;
the logic to perform a first program operation applies a first voltage pulse across the metal-oxide memory element; and
the logic to perform a second program operation applies a second voltage pulse across the metal-oxide memory element, the second voltage pulse having a voltage polarity the same as that of the first voltage pulse.

23. The memory device of claim 22, wherein the memory cell is a multibit cell, and the controller includes logic to perform program operations for at least one additional resistance state.

* * * * *